US012568740B2

(12) United States Patent
Kim et al.

(10) Patent No.: US 12,568,740 B2
(45) Date of Patent: *Mar. 3, 2026

(54) DISPLAY APPARATUS WITH REDUCED NON-DISPLAY AREA

(71) Applicant: Samsung Display Co., Ltd., Yongin-si (KR)

(72) Inventors: Jaeik Kim, Yongin-si (KR); Taewook Kang, Yongin-si (KR); Seungyong Song, Yongin-si (KR); Duckjung Lee, Yongin-si (KR); Joongu Lee, Yongin-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 661 days.

This patent is subject to a terminal disclaimer.

(21) Appl. No.: 17/879,801

(22) Filed: Aug. 3, 2022

(65) Prior Publication Data

US 2023/0078082 A1      Mar. 16, 2023

(30) Foreign Application Priority Data

Sep. 16, 2021    (KR) .................. KR10-2021-0124257

(51) Int. Cl.
H10K 59/131        (2023.01)
H10K 59/122        (2023.01)
(52) U.S. Cl.
CPC ......... H10K 59/131 (2023.02); H10K 59/122 (2023.02)
(58) Field of Classification Search
CPC ........................... H10K 59/122; H10K 59/131
See application file for complete search history.

(56) References Cited

U.S. PATENT DOCUMENTS 10,403,861 B2    9/2019 Lee et al.
12,245,476 B2 *  3/2025 Kim ..................... H10K 59/124
(Continued)

FOREIGN PATENT DOCUMENTS

KR    10-2013-0005854    1/2013
KR    10-2013-0071543    7/2013
(Continued)

OTHER PUBLICATIONS

International Search Report issued Nov. 28, 2022, in PCT Patent Application No. PCT/KR2022/011849. (with English translation).

*Primary Examiner* — Norman D Richards
*Assistant Examiner* — Sammantha K Salaz
(74) *Attorney, Agent, or Firm* — Harness, Dickey & Pierce, P.L.C.

(57)        ABSTRACT

A display apparatus includes an auxiliary wiring on a substrate, an insulating layer disposed on the auxiliary wiring and that includes a first opening that overlaps the auxiliary wiring and has a greater width than a width of the auxiliary wiring, a first electrode disposed on the insulating layer, a bank layer that includes an emission opening that overlaps the first electrode, an intermediate layer that overlaps the first electrode through the emission opening and that includes an emission layer, and a second electrode disposed on the intermediate layer, wherein the auxiliary wiring includes a plurality of sub-layers, and the second electrode contacts a side surface of any one of the plurality of sub-layers through the first opening of the insulating layer.

18 Claims, 18 Drawing Sheets

(56)     References Cited

U.S. PATENT DOCUMENTS

| | | | | |
|---|---|---|---|---|
| 2012/0161167 A1* | 6/2012 | Yamazaki | ............. | H10K 59/86 |
| | | | | 438/34 |
| 2013/0187167 A1* | 7/2013 | Jin | ...................... | H10K 59/131 |
| | | | | 438/34 |
| 2014/0061567 A1 | 3/2014 | Choi et al. | | |
| 2016/0149155 A1 | 5/2016 | Kim | | |
| 2018/0062109 A1* | 3/2018 | Kim | .................... | H10K 50/824 |
| 2019/0115403 A1 | 4/2019 | Kang | | |
| 2020/0335025 A1 | 10/2020 | Kim et al. | | |
| 2020/0395430 A1 | 12/2020 | Jeong et al. | | |
| 2021/0020725 A1 | 1/2021 | Park et al. | | |
| 2021/0036073 A1 | 2/2021 | Cho et al. | | |
| 2021/0202655 A1 | 7/2021 | Cho et al. | | |

FOREIGN PATENT DOCUMENTS

| | | |
|---|---|---|
| KR | 10-2017-0063326 | 6/2017 |
| KR | 10-2019-0042395 | 4/2019 |
| KR | 10-2019-0079954 | 7/2019 |
| KR | 10-2020-0049223 | 5/2020 |
| KR | 10-2020-0143622 | 12/2020 |
| KR | 10-2021-0009486 | 1/2021 |
| KR | 10-2021-0016145 | 2/2021 |

* cited by examiner

DISPLAY APPARATUS WITH REDUCED NON-DISPLAY AREA

CROSS-REFERENCE TO RELATED APPLICATION

This application claims priority from and the benefit of Korean Patent Application No. 10-2021-0124257, filed on Sep. 16, 2021, which is hereby incorporated by reference for all purposes as if fully set forth herein.

BACKGROUND

Field

Embodiments of the invention relate generally to a display apparatus.

Discussion of the Background

In general, in a display apparatus such as an organic light emitting diode display, transistors are arranged in a display area to control the luminance of light emitting diodes. The transistors are configured to control the light emitting diodes to emit light having a predetermined color using a transmitted data signal, driving voltage, and common voltage.

One of the electrodes of a light emitting diode may receive a predetermined voltage through a transistor, and another electrode of the light emitting diode may receive a voltage through an auxiliary wiring.

The above information disclosed in this Background section is only for understanding of the background of the inventive concepts, and, therefore, it may contain information that does not constitute prior art.

SUMMARY

Devices constructed according to illustrative implementations consistent with inventive concepts of the invention are capable of providing a display apparatus in which display quality may be improved and the area of a dead space located around a display area may be reduced.

As the proportion of a display area capable of providing an image in a display apparatus increases, it is necessary to reduce a non-display area as a dead space in which light emitting diodes are not arranged. On the other hand, as the space in which components arranged in the non-display area is to be located becomes narrow, the quality of light emitted from light emitting diodes may be deteriorated.

Inventive concepts consistent with embodiments of the invention are directed to solve various problems including the above problems, and an inventive concept is directed to provide a display apparatus, in which a high-quality image is displayed while an area of a dead space being reduced. However, these problems are illustrative, and the scope of the embodiments described hereinbelow is not limited thereto.

Additional features of the inventive concepts will be set forth in the description which follows, and in part will be apparent from the description, or may be learned by practice of the inventive concepts.

According to an embodiment, a display apparatus includes an auxiliary wiring on a substrate, an insulating layer disposed on the auxiliary wiring and that includes a first opening that overlaps the auxiliary wiring and has a greater width than a width of the auxiliary wiring, a first electrode disposed on the insulating layer, a bank layer that includes an emission opening that overlaps the first electrode, an intermediate layer that overlaps the first electrode through the emission opening and that includes an emission layer, and a second electrode disposed on the intermediate layer, wherein the auxiliary wiring includes a plurality of sub-layers, and the second electrode contacts a side surface of any one of the plurality of sub-layers through the first opening of the insulating layer.

The plurality of sub-layers of the auxiliary wiring may include a main sub-layer, an upper layer disposed over the main sub-layer and having a tip protruding from a point at which side and upper surfaces of the main sub-layer meet each other, and a lower layer disposed under the main sub-layer, and the second electrode may directly contact the side surface of the main sub-layer.

A thickness of the main sub-layer may be greater than any one of a thickness of the upper layer and a thickness of the lower layer.

The intermediate layer may overlap the first electrode and the auxiliary wiring, and a part of the intermediate layer may be located on the auxiliary wiring while being separated from another part of the intermediate layer by the tip around the auxiliary wiring.

The second electrode may overlap the first electrode and the auxiliary wiring, and a part of the second electrode may be located on the auxiliary wiring while being separated from another part of the second electrode by the tip around the auxiliary wiring.

The main sub-layer may include at least one selected from copper (Cu), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), and molybdenum (Mo).

Any one of the upper layer and the lower layer may include at least one selected from indium tin oxide (ITO), titanium (Ti), molybdenum (Mo), and tungsten (W).

The display apparatus may further include a lower insulating layer disposed under the auxiliary wiring, and a part of the intermediate layer may directly contact a part of an upper surface of the lower insulating layer through the first opening of the insulating layer.

In a plan view, the auxiliary wiring may include a plurality of protrusions protruding in a direction crossing an extension direction of the auxiliary wiring.

A contact region of the second electrode and the side surface of the auxiliary wiring may be continuous along a side surface of at least one of the plurality of protrusions.

According to another embodiment, a display apparatus includes a substrate disposed in a display area and a non-display area around the display area, an auxiliary wiring electrically connected to the common voltage supply line and disposed in the display area, an insulating layer disposed on the auxiliary wiring and that includes a first opening that overlaps the auxiliary wiring and has a greater width than a width of the auxiliary wiring, a first electrode disposed on the insulating layer, a bank layer that includes an emission opening that overlaps the first electrode, an intermediate layer that overlaps the first electrode through the emission opening and that includes an emission layer, and a second electrode disposed on the intermediate layer, wherein the auxiliary wiring includes a plurality of sub-layers, and the second electrode contacts a side surface of any one of the plurality of sub-layers through the first opening of the insulating layer.

The plurality of sub-layers of the auxiliary wiring may include a main sub-layer, an upper layer disposed over the main sub-layer and having a tip protruding from a point at which side and upper surfaces of the main sub-layer meet each other, and a lower layer disposed under the main sub-layer, and the second electrode may directly contact the side surface of the main sub-layer.

A thickness of the main sub-layer may be greater than any one of a thickness of the upper layer and a thickness of the lower layer.

The intermediate layer may overlap the first electrode and the auxiliary wiring, and a part of the intermediate layer may be located on the auxiliary wiring while being separated from another part of the intermediate layer by the tip around the auxiliary wiring.

The second electrode may overlap the first electrode and the auxiliary wiring, and a part of the second electrode may be located on the auxiliary wiring while being separated from another part of the second electrode by the tip around the auxiliary wiring.

The main sub-layer may include at least one selected from copper (Cu), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), and molybdenum (Mo).

Any one of the upper layer and the lower layer may include at least one selected from indium tin oxide (ITO), titanium (Ti), molybdenum (Mo), and tungsten (W).

The display apparatus may further include a lower insulating layer disposed under the auxiliary wiring, and a part of the intermediate layer may directly contact a part of an upper surface of the lower insulating layer through the first opening of the insulating layer.

In a plan view, the auxiliary wiring may include a plurality of protrusions protruding in a direction crossing an extension direction of the auxiliary wiring.

A contact region of the second electrode and the side surface of the auxiliary wiring may be continuous along a side surface of at least one of the plurality of protrusions.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
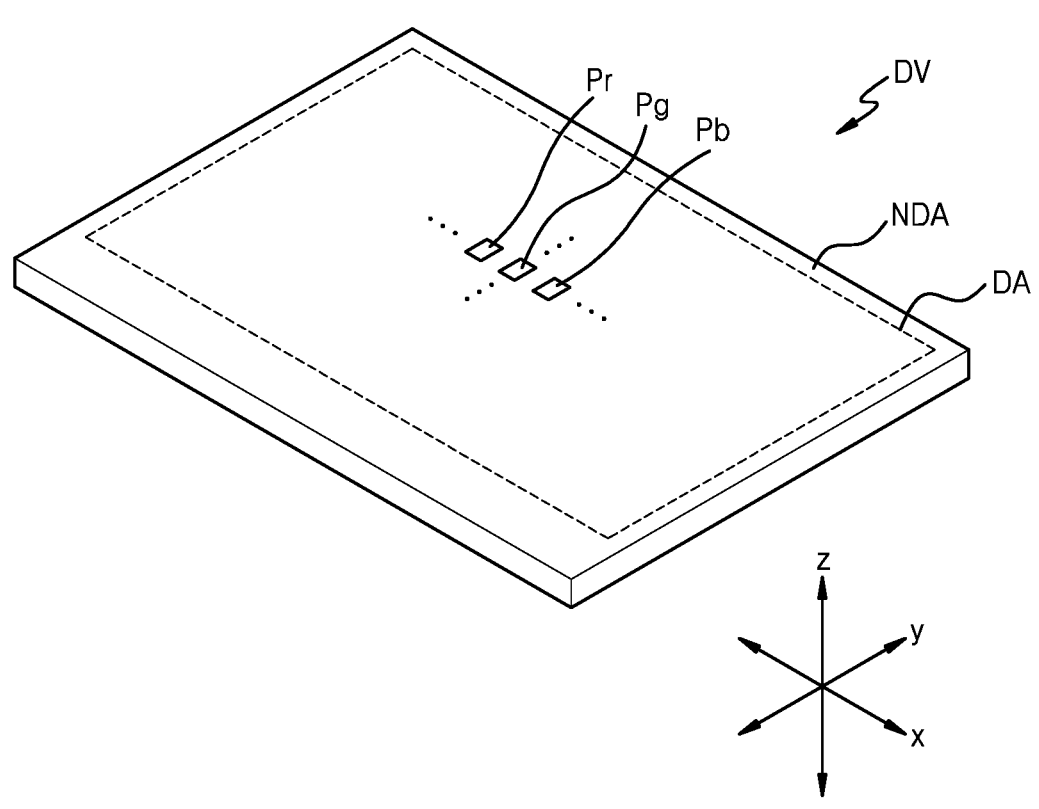
FIG. 1 is a perspective view schematically illustrating a display apparatus according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the x-axis, the y-axis, and the z-axis are not limited to three axes of a rectangular coordinate system, and may be interpreted in a broader sense to cover other coordinate systems such as a spherical coordinate system. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view schematically illustrating a display apparatus according to an embodiment that is constructed according to principles of the invention.

Referring to FIG. 1, a display apparatus DV may include a display area DA and a non-display area NDA around (e.g., outside) the display area DA. The display apparatus DV may provide an image in the display area DA through an array of a plurality of pixels that are two-dimensionally arranged on the x-y plane. The plurality of pixels include a first pixel, a second pixel, and a third pixel. Hereinafter, for convenience of description, a case in which the first pixel is a red pixel Pr, the second pixel is a green pixel Pg, and the third pixel is a blue pixel Pb will be described.

The red pixel Pr, the green pixel Pg, and the blue pixel Pb are regions capable of emitting red light, green light, and blue light, respectively. The display apparatus DV may provide an image using light emitted from pixels.

The non-display area NDA is an area that does not provide an image, and may entirely surround the display area DA. A driver or a main voltage line for providing an electrical signal or power to pixel circuits may be arranged in the non-display area NDA. The non-display area NDA may include a pad, which is a region to which an electronic device or a printed circuit board may be electrically connected.

As shown in FIG. 1, the display area DA may have a polygonal shape including a quadrangle. For example, the display area DA may have a rectangular shape in which a horizontal length is greater than a vertical length, a rectangular shape in which a horizontal length is less than a vertical length, or a square shape. Alternatively, the display area DA may have various shapes such as an ellipse or a circle. The display apparatus DV may be an electronic apparatus (or electronic product) such as a television. In another embodiment, the display apparatus DV may include various electronic products such as outdoor advertisement boards, and movie display apparatus. For example, just as the display apparatus DV may be applicable to a display portion of artificial intelligence speakers, the display apparatus DV according to an embodiment may be applicable to any kind of electronic apparatus as far as the electronic apparatus may provide a preset image.

Figure 2:
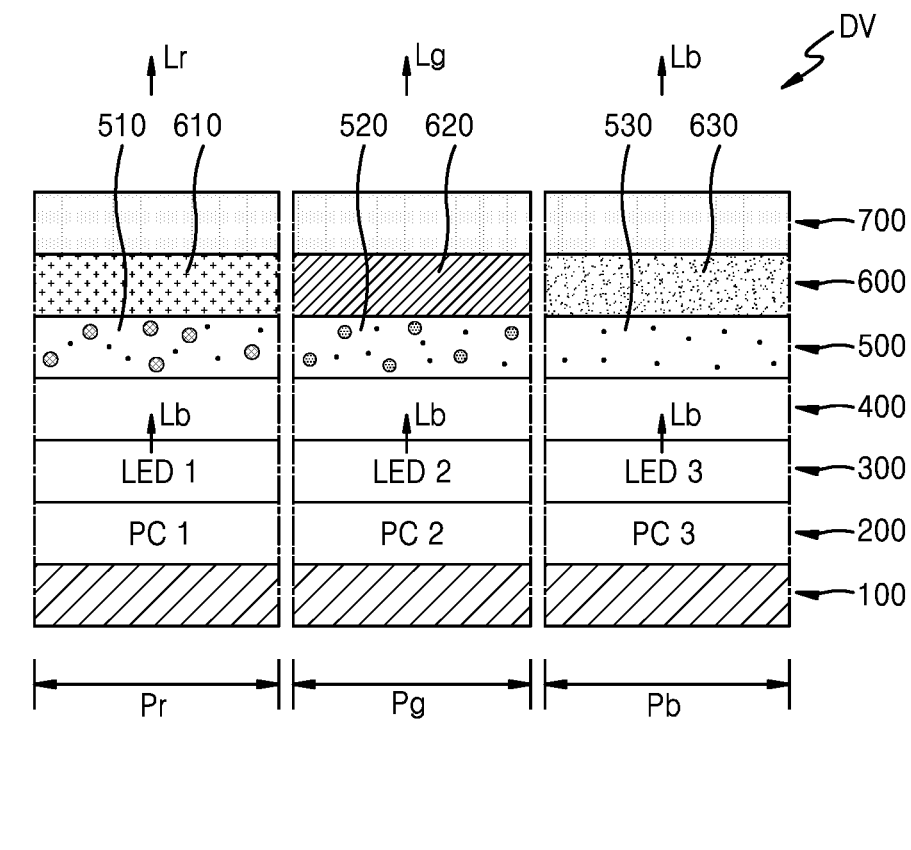
FIG. 2 is a cross-sectional view schematically illustrating respective pixels of the display apparatus according to the embodiment.

FIG. 2 is a cross-sectional view schematically illustrating respective pixels of the display apparatus according to the embodiment.

Referring to FIG. 2, the display apparatus DV may include a circuit layer 200 on a substrate 100. The circuit layer 200 includes first to third pixel circuits PC1, PC2, and PC3, and the first to third pixel circuits PC1, PC2, and PC3 may be electrically connected to first to third light emitting diodes LED1, LED2, and LED3 of a light emitting diode layer 300, respectively.

The first to third light emitting diodes LED1, LED2, and LED3 may be organic light emitting diodes including an organic material. Alternatively, the first to third light emitting diodes LED1, LED2, and LED3 may be inorganic light emitting diodes including an inorganic material. The inorganic light emitting diode may be a PN junction diode including an inorganic semiconductor-based material. When a voltage is applied to the PN junction diode in the forward direction, holes and electrons are injected, and energy generated by recombination of the holes and electrons is converted into light energy to emit light of a predetermined color. The above-described inorganic light emitting diode may have a width of several to several hundred micrometers or several to several hundred nanometers. In some embodiment, the light emitting diode (LED) may be a light emitting diode including quantum dots. As described above, a light emitting layer of the LED may include an organic material, an inorganic material, quantum dots, an organic material and quantum dots, or an inorganic material and quantum dots.

The first to third light emitting diodes LED1, LED2, and LED3 may emit light of the same color. For example, light (for example, blue light Lb) emitted from the first to third light emitting diodes LED1, LED2, and LED3 passes through an encapsulation layer 400 on the light emitting diode layer 300 and passes through a color conversion-transmitting layer 500.

The color conversion-transmitting layer 500 may include optical units that convert the color of light (for example, blue light Lb) emitted from the light emitting diode layer 300 or transmit the light without conversion. For example, the color conversion-transmitting layer 500 may include color conversion units that convert light (for example, blue light Lb) emitted from the light emitting diode layer 300 into light of another color, and a transmission unit that transmits light (for example, blue light Lb) emitted from the light emitting diode layer 300 without color conversion. The color conversion-transmitting layer 500 may include a first color conversion unit 510 corresponding to the red pixel Pr, a second color conversion unit 520 corresponding to the green pixel Pg, and a transmission unit 530 corresponding to the blue pixel Pb. The first color conversion unit 510 may convert blue light Lb into red light Lr, and the second color conversion unit 520 may convert blue light Lb into green light Lg. The transmission unit 530 may transmit blue light Lb without converting the light Lb.

A color layer 600 may be disposed on the color conversion-transmitting layer 500. The color layer 600 may include first to third color filters 610, 620, and 630 having different colors from each other. For example, the first color filter 610 may be a red color filter, the second color filter 620 may be a green color filter, and the third color filter 630 may be a blue color filter.

The color-converted light and transmitted light in the color conversion-transmitting layer 500 pass through the first to third color filters 610, 620, and 630, respectively, and thus color purity may be improved. In addition, the color layer 600 may prevent or minimize external light (for example, light incident from the outside of the display apparatus DV toward the display apparatus DV) from being reflected to be recognized by a user.

A light-transmitting base layer 700 may be provided on the color layer 600. The light-transmitting base layer 700 may include glass or a light-transmitting organic material. For example, the light-transmitting base layer 700 may include a light-transmitting organic material such as an acrylic resin.

In an embodiment, the light-transmitting base layer 700 is a kind of substrate. After the color layer 600 and the color conversion-transmitting layer 500 are formed on the light-transmitting base layer 700, the light-transmitting base layer 700 may be integrated with the color layer 600 and the color conversion-transmitting layer 500 such that the color conversion-transmitting layer 500 faces the encapsulation layer 400.

In another embodiment, after the color conversion-transmitting layer 500 and the color layer 600 are sequentially formed on the encapsulation layer 400, the light-transmitting base layer 700 may be formed by direct application and curing. In some embodiments, another optical film, such as an anti-reflection (AR) film, may be disposed on the light-transmitting base layer 700.

The display apparatus DV having the above-described structure may be used for electronic appliances capable of displaying a moving image or a still image, such as a television, a billboard, a cinema screen, a monitor, a tablet PC, and a notebook computer.

Figure 3:
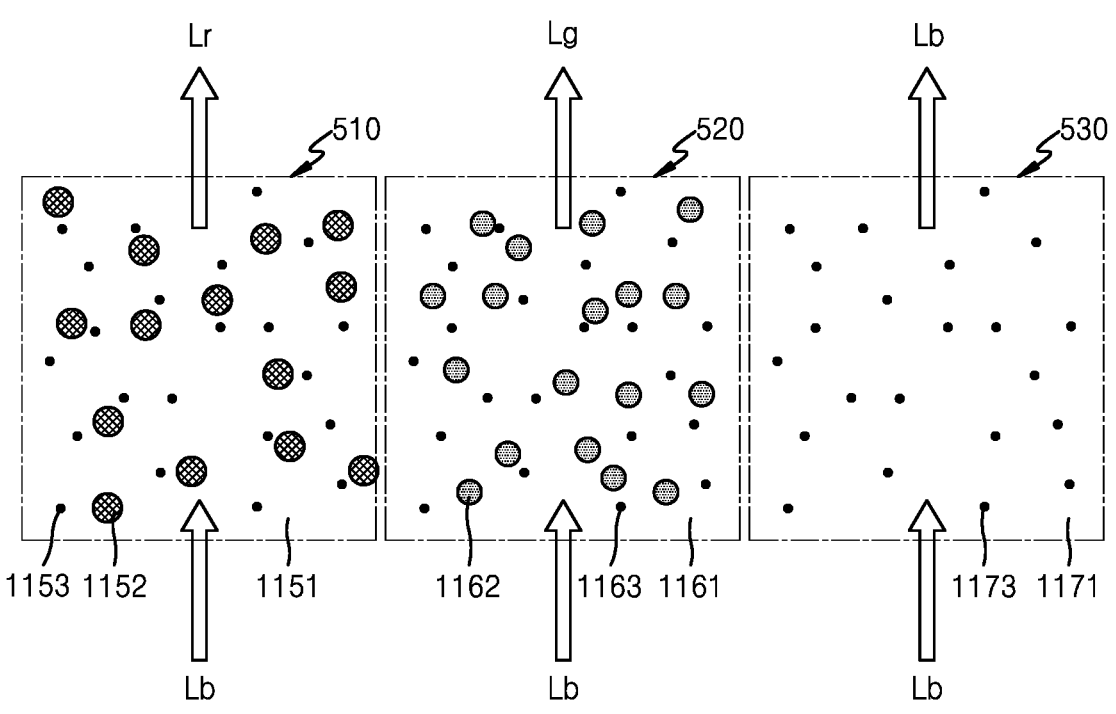
FIG. 3 illustrates optical units of a color conversion-transmitting layer of FIG. 2.

FIG. 3 illustrates optical units of the color conversion-transmitting layer of FIG. 2.

Referring to FIG. 3, the first color conversion unit 510 may convert incident blue light Lb into red light Lr. As shown in FIG. 3, the first color conversion unit 510 may include a first photosensitive polymer 1151, and first quantum dots 1152 and first scattering particles 1153 dispersed in the first photosensitive polymer 1151.

The first quantum dots 1152 may be excited by blue light Lb to isotropically emit red light Lr having a longer wavelength than blue light Lb. The first photosensitive polymer 1151 may be an organic material having light transmittance. The first scattering particles 1153 scatter the blue light Lb not absorbed by the first quantum dots 1152 to excite a larger number of first quantum dots 1152, thereby increasing color conversion efficiency. The first scattering particles 1153 may be, for example, titanium oxide ($TiO_2$) particles or metal particles. The first quantum dots 1152 may be selected from group II-VI compounds, group III-V compounds, group IV-VI compounds, group IV elements, group IV compounds, and combinations thereof.

The second color conversion unit 520 may convert incident blue light Lb into green light Lg. As shown in FIG. 3, the second color conversion unit 520 may include a second photosensitive polymer 1161, and second quantum dots 1162 and second scattering particles 1163 dispersed in the second photosensitive polymer 1161.

The second quantum dots 1162 may be excited by blue light Lb to isotropically emit green light Lg having a longer wavelength than blue light Lb. The second photosensitive polymer 1161 may be an organic material having light transmittance.

The second scattering particles 1163 scatter the blue light Lb not absorbed by the second quantum dots 1162 to excite a larger number of second quantum dots 1162, thereby increasing color conversion efficiency. The second scattering particles 1163 may be, for example, titanium oxide (TiO$_2$) particles or metal particles. The second quantum dots 1162 may be selected from group II-VI compounds, group III-V compounds, group IV-VI compounds, group IV elements, group IV compounds, and combinations thereof.

In some embodiments, the first quantum dots 1152 may be the same material as the second quantum dots 1162. In this case, the size of the first quantum dots 1152 may be greater than the size of the second quantum dots 1162.

The transmission unit 530 may transmit blue light Lb incident to the transmission unit 530 without converting the light Lb. As shown in FIG. 3, the transmission unit 530 may include a third photosensitive polymer 1171 in which third scattering particles 1173 are dispersed. The third photosensitive polymer 1171 may be, for example, an organic material having light transmittance such as a silicone resin or an epoxy resin, and may be the same material as the first and second photosensitive polymers 1151 and 1161. The third scattering particles 1173 may scatter and emit blue light Lb, and may be the same material as the first and second scattering particles 1153 and 1163.

Figure 4:
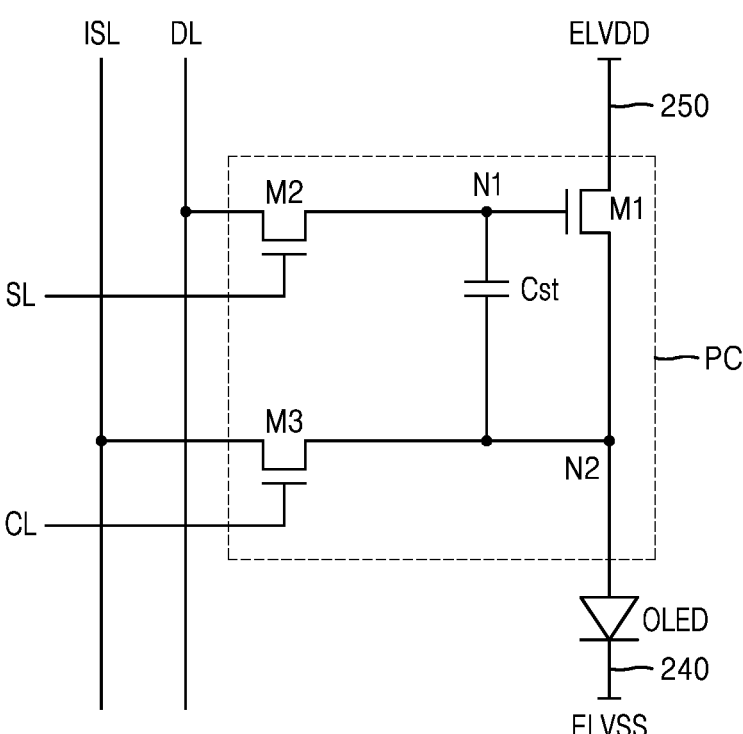
FIG. 4 is an equivalent circuit diagram illustrating a light emitting diode and a pixel circuit electrically connected to the light emitting diode, which are included in the display apparatus according to the embodiment.

FIG. 4 is an equivalent circuit diagram illustrating a light emitting diode and a pixel circuit electrically connected to the light emitting diode, which are included in the display apparatus according to the embodiment. The pixel circuit PC shown in FIG. 4 may corresponds to each of the first to third pixel circuits PC1, PC2, and PC3 described with reference to FIG. 2, and the light emitting diode LED of FIG. 4 may correspond to each of the first to third light emitting diodes LED1, LED2, and LED3 described with reference to FIG. 2.

Referring to FIG. 4, a first electrode (for example, an anode) of the light emitting diode LED may be connected to the pixel circuit PC, and a second electrode (for example, a cathode) of the light emitting diode LED may be connected to an auxiliary wiring 240 providing a common voltage ELVSS. The light emitting diode LED may emit light with a luminance corresponding to the amount of current supplied from the pixel circuit PC.

The light emitting diode LED of FIG. 4 may correspond to each of the first to third light emitting diodes LED1, LED2, and LED3 shown in FIG. 2, and the pixel circuit PC of FIG. 4 may correspond to each of the first to third pixel circuits PC1, PC2, and PC3 shown in FIG. 2.

The pixel circuit PC may control the amount of current flowing from a driving voltage ELVDD to a common voltage ELVSS via a light emitting diode LED in response to a data signal. The pixel circuit PC may include a first transistor M1, a second transistor M2, a third transistor M3, and a storage capacitor Cst.

Each of the first transistor M1, the second transistor M2, and the third transistor M3 may be an oxide semiconductor transistor including a semiconductor layer made of an oxide semiconductor, or may be a silicon semiconductor transistor including a semiconductor layer made of polysilicon. Depending on the type of a transistor, a first electrode may be one of a source electrode and a drain electrode, and a second electrode may be the other one of a source electrode and a drain electrode.

The first electrode of the first transistor M1 may be connected to a driving voltage line 250 for supplying a driving voltage ELVDD, and the second electrode thereof may be connected to a first electrode of the light emitting diode LED. The gate electrode of the first transistor M1 may be connected to a first node N1. The first transistor M1 may control the amount of current flowing from the driving voltage ELVDD to the light emitting diode LED in response to a voltage of the first node N1.

The second transistor M2 may be a switching transistor. The first electrode of the switching transistor M2 may be connected to a data line DL, and the second electrode thereof may be connected to the first node N1. The gate electrode of the switching transistor M2 may be connected to a scan line SL. The switching transistor M2 is turned on when a scan signal is supplied to the scan line SL to electrically connect the data line DL and the first node N1.

The third transistor M3 may be an initialization transistor and/or a sensing transistor. The first electrode of the sensing transistor M3 may be connected to a second node N2, and the second electrode thereof may be connected to a sensing line SEL. The gate electrode of the sensing transistor M3 may be connected to a control line CL.

The storage capacitor Cst may be connected between the first node N1 and the second node N2. For example, the first capacitor electrode of the storage capacitor Cst may be connected to the gate electrode of the driving transistor M1, and the second capacitor electrode of the storage capacitor Cst may be connected to the first electrode of the light emitting diode LED.

Although the driving transistor M1, the switching transistor M2, and the sensing transistor M3 are illustrated as N-type MOSFETs in FIG. 4, but the present disclosure is not limited thereto. For example, at least one of the driving transistor M1, the switching transistor M2, and the sensing transistor M3 may be formed as a P-type MOSFET. In some embodiments, the switching transistor M2 and/or the sensing transistor M3 may be formed as a P-type MOSFET.

Although three transistors are illustrated in FIG. 4, the present disclosure is not limited thereto. The pixel circuit PC may include four or more transistors.

Figure 5A:
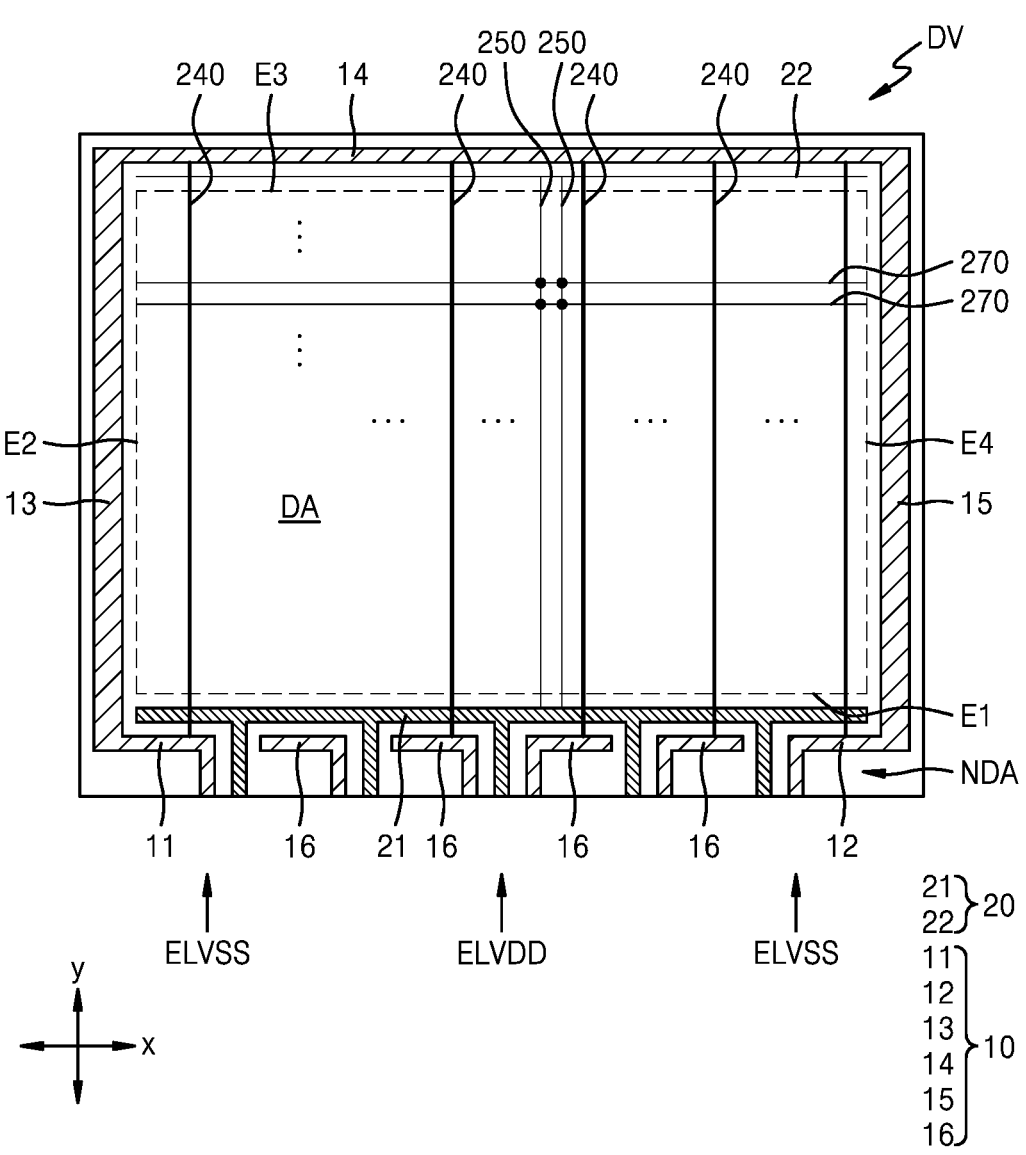
FIG. 5A is a plan view illustrating a common voltage supply line and a driving voltage supply line of the display apparatus according to the embodiment.

FIG. 5A is a plan view illustrating a common voltage supply line and a driving voltage supply line of the display apparatus according to the embodiment.

Referring to FIG. 5A, the display apparatus DV may include a common voltage supply line 10 for supplying the common voltage ELVSS to the pixel circuit described with reference to FIG. 4, and a driving voltage supply line 20 for supplying the driving voltage ELVDD to the second electrode of the light emitting diode. The common voltage supply line 10 and the driving voltage supply line 20 may be arranged in the non-display area NDA.

The shape of the display apparatus DV may be substantially the same as that of the substrate 100. For example, the substrate 100 may include a display area DA and a non-display area DA around (e.g., outside) the display area DA. Hereinafter, for convenience of description, it will be described that the substrate 100 includes a display area DA and a non-display area DA around (e.g., outside) the display area DA.

The common voltage supply line 10 may include a first common voltage input unit 11 and a second common voltage input unit 12 which are arranged adjacent to a first edge E1 of the display area DA. The first common voltage input unit 11 and the second common voltage input unit 12 are spaced apart from each other along the x-direction, but may be integrally connected through first to third extension portions 13, 14, and 15 arranged adjacent to second to fourth edges E2, E3, and E4 of the display area DA.

At least one third common voltage input unit 16 may be disposed between the first common voltage input unit 11 and the second common voltage input unit 12. In an embodiment, FIG. 5A illustrates four third common voltage input units 16.

The common voltage supply line 10 may be electrically connected to auxiliary wirings 240 passing through the display area DA. As shown in FIG. 5A, the auxiliary wirings 240 may extend along the y-direction. At least one auxiliary wiring 240 may extend to cross the display area DA along the y-direction, and may be electrically connected to the first common voltage input unit 11 and a part of the second extension portion 14 facing the first common voltage input unit 11. At least one auxiliary wiring 240 may extend to cross the display area DA along the y-direction, and may be electrically connected to the second common voltage input unit 12 and a part of the second extension portion 14 facing the second common voltage input unit 12. Similarly, at least one auxiliary wiring 240 may extend to cross the display area DA along the y-direction, and may be electrically connected to the third common voltage input unit 16 and a part of the second extension portion 14 facing the third common voltage input unit 16.

In the case where the common voltage supply line 10 includes the third common voltage input unit 16 disposed between the first common voltage input unit 11 and the second common voltage supply line 12, when the current supplied through the common voltage supply line 10 is applied, current density may be lowered, and heat generation may be suppressed, compared to the case where only the first common voltage input unit 11 and the second common voltage supply line 12 are provided.

The driving voltage supply line 20 is located in the non-display area NDA, but may include a driving voltage supply unit 21 adjacent to the first edge E1 of the display area DA and a counterpart extending along the third edge E3 of the display area DA. The driving voltage supply unit 21 and the counterpart 22 may be disposed at both sides of the display area DA with the display area DA interposed therebetween.

The driving voltage supply line 20 may be electrically connected to driving voltage lines 250 crossing the display area DA. Each of the driving voltage lines 250 may extend along the y-direction while being electrically connected to the driving voltage supply unit 21. In some embodiments, the driving voltage lines 250 may be electrically connected to horizontal driving voltage lines 270 extending along the x-direction to cross the driving voltage lines 250. The driving voltage line 250 and the horizontal driving voltage line 270 are disposed on different layers from each other, and may be electrically connected through a contact hole penetrating at least one insulating layer interposed therebetween.

Figure 5B:
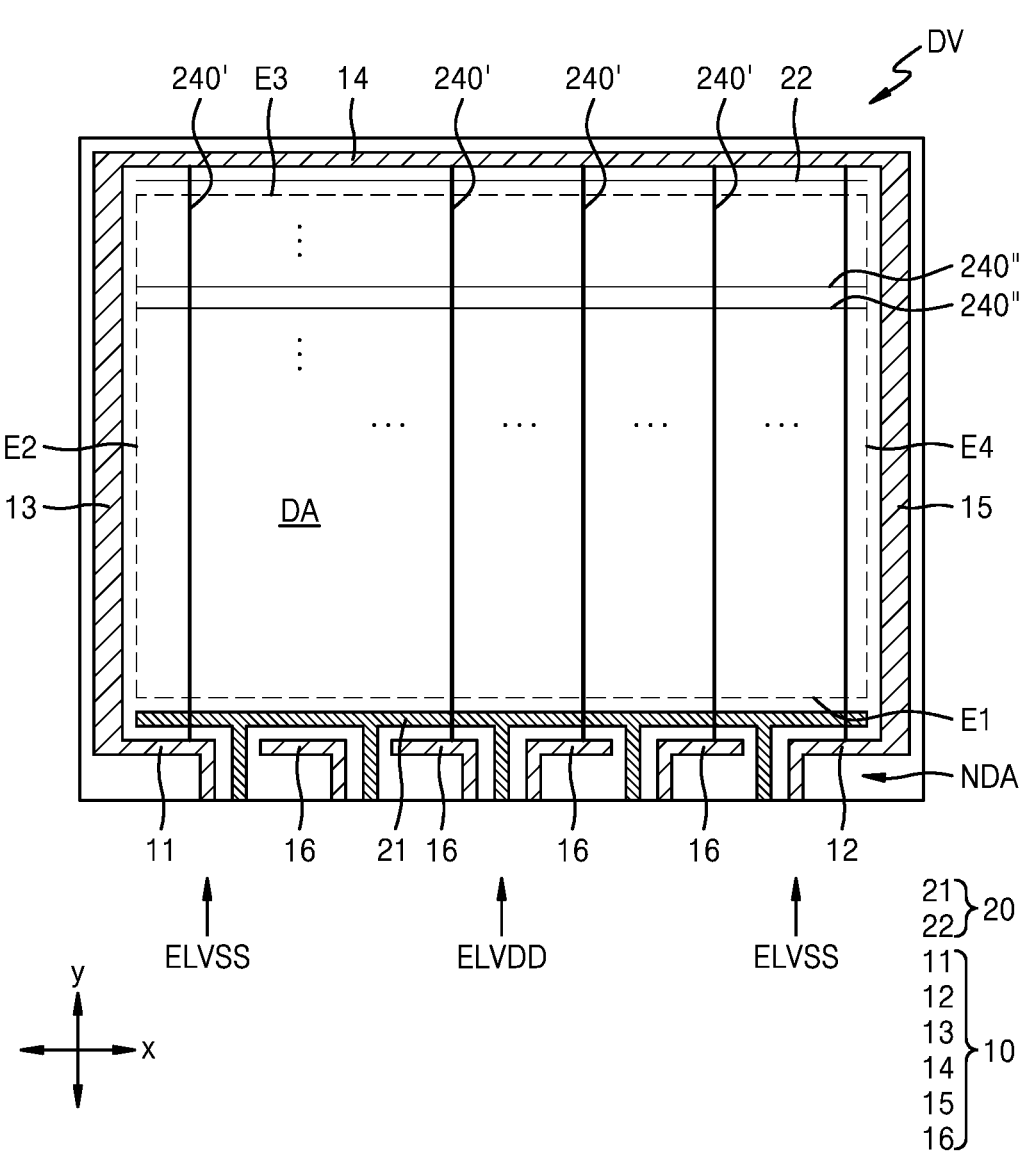
FIGS. 5B and 5C are plan views each illustrating a common voltage supply line of a display apparatus according to another embodiment.
Figure 5C:
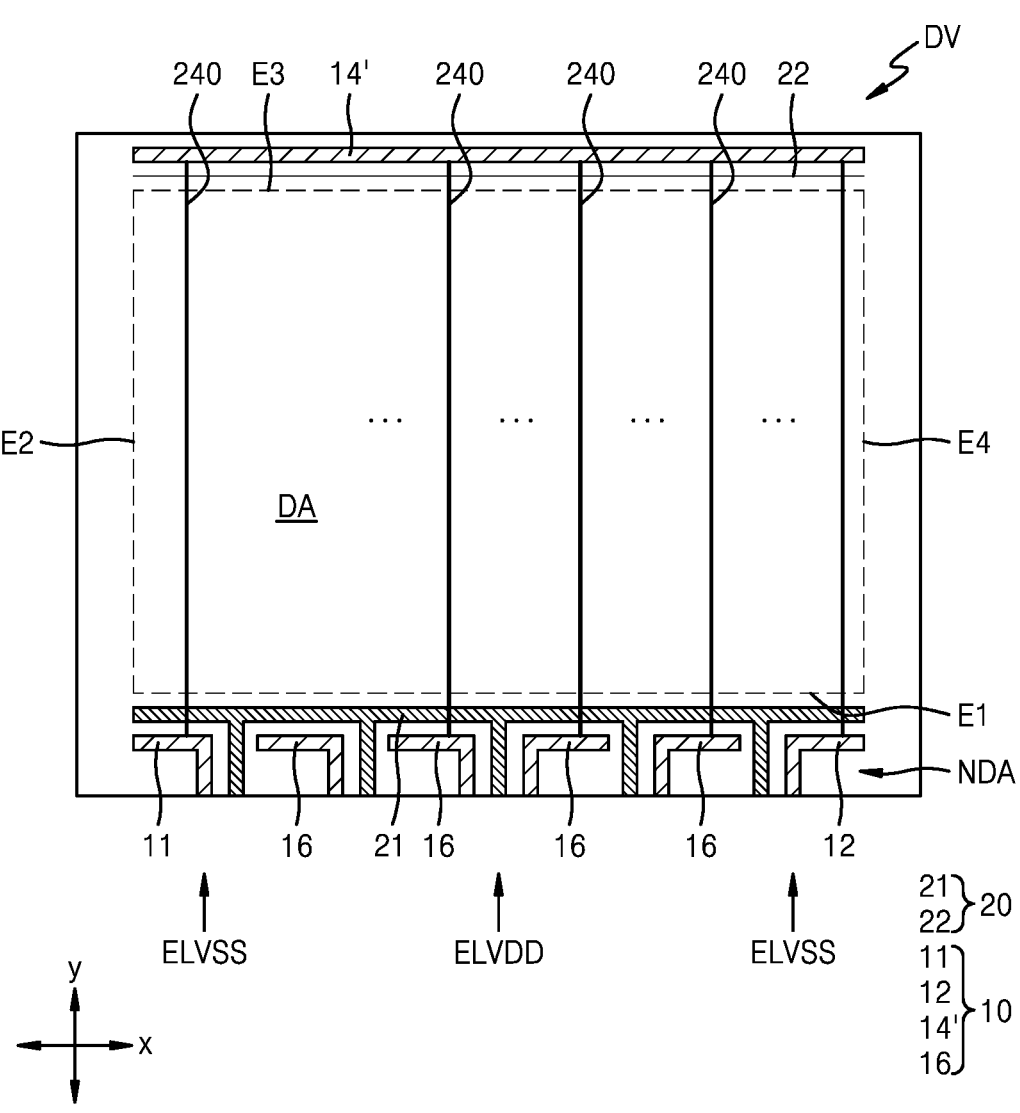

FIGS. 5B and 5C are plan views each illustrating a common voltage supply line of a display apparatus according to another embodiment. As previously described with reference to FIG. 5A, the display apparatus DV shown in FIGS. 5B and 5C includes a driving voltage line 250 (FIG. 5A) and a horizontal driving voltage line 270 (FIG. 5A) electrically connected to the driving voltage supply line 20. For convenience of description, the driving voltage line 250 (FIG. 5A) and the horizontal driving voltage line 270 (FIG. 5A) will be omitted in FIGS. 5B and 5C for ease in explanation of these figures.

Referring to FIG. 5B, the display apparatus DV may include an auxiliary wiring 240' (hereinafter referred to as a first auxiliary wiring) crossing the display area DA along the y-direction and an auxiliary wiring 240" (hereinafter referred to as a second auxiliary wiring) crossing the display area DA along the x-direction. The first auxiliary wiring 240' and the second auxiliary wiring 240", crossing each other, may be disposed on different layers, and may be electrically connected through a through-hole formed in at least one insulating layer interposed therebetween.

Although it is shown in FIGS. 5A and 5B that the first common voltage input unit 11 and second common voltage input unit 12 of the common voltage supply line 10 are integrally connected through the first to third extension portions 13, 14, 15, the embodiments described herein are not limited thereto.

In another embodiment, as shown in FIG. 5C, the driving voltage supply line 10 may include the first common voltage input unit 11 and second common voltage input unit 12 disposed adjacent to the first edge E1 of the display area DA, and an extension portion 14' disposed adjacent to the third edge E3 of the display area DA. The extension portion 14' may be physically separated from the first common voltage input unit 11 and the second common voltage input unit 12.

One end of each of the auxiliary wirings 240 may be electrically connected to the first to third common voltage input units 11, 12, and 16, and the other end thereof may be connected to the extension portion 14'. In other words, since the first to third common voltage input units 11, 12, 16 and the extension portion 14' are electrically connected by the auxiliary wirings 240 crossing the display area DA, as previously shown in FIGS. 5A and 5B, the first extension portion 13 and the third extension portion 15 may be omitted in some implementations of this embodiment. By omitting the first extension portion 13 and the third extension portion 15, a part of the non-display area NDA (for example, a part of the non-display area NDA adjacent to the second edge E2 and fourth edge E4 of the display area DA) may be reduced.

Figure 6:
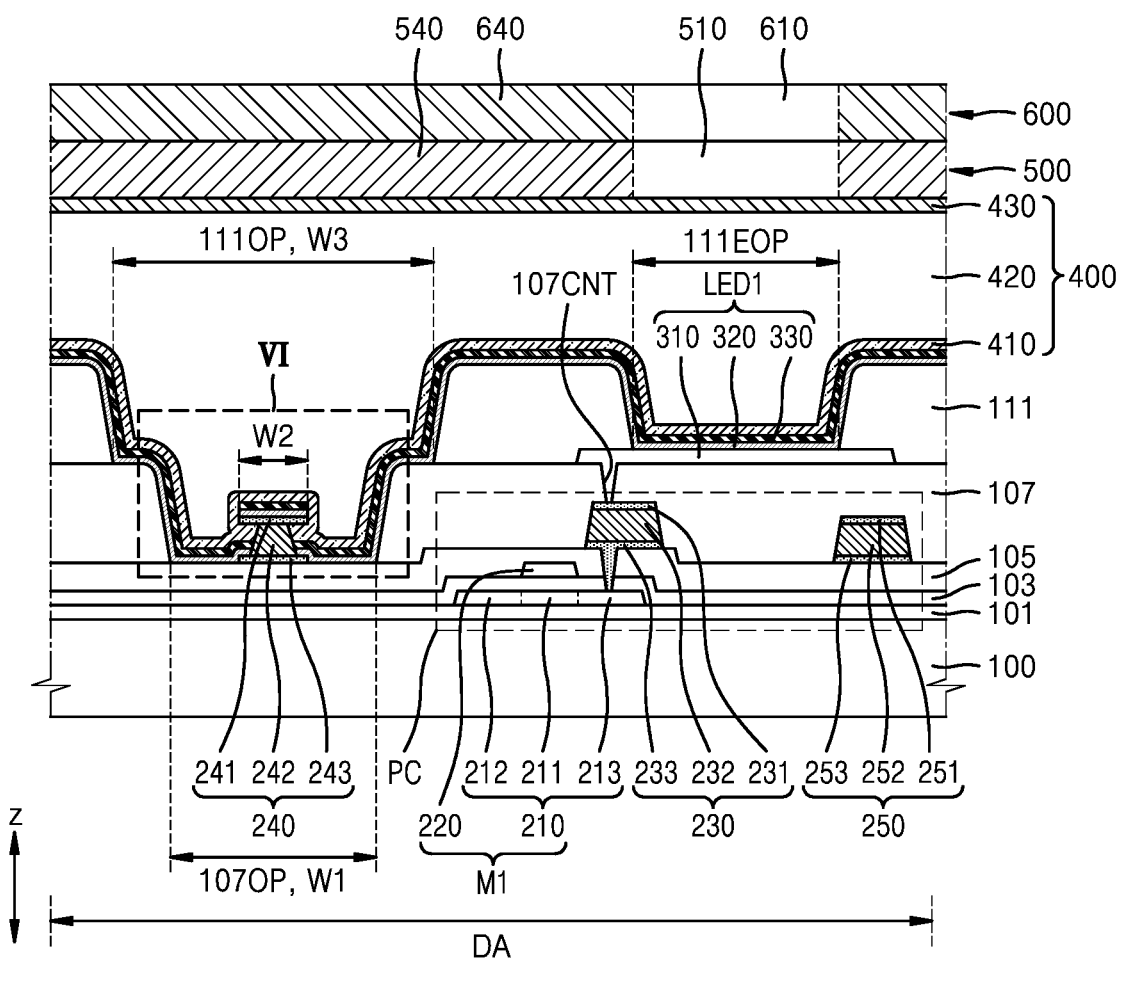
FIG. 6 is a cross-sectional view illustrating a part of a display apparatus according to an embodiment.
Figure 7:
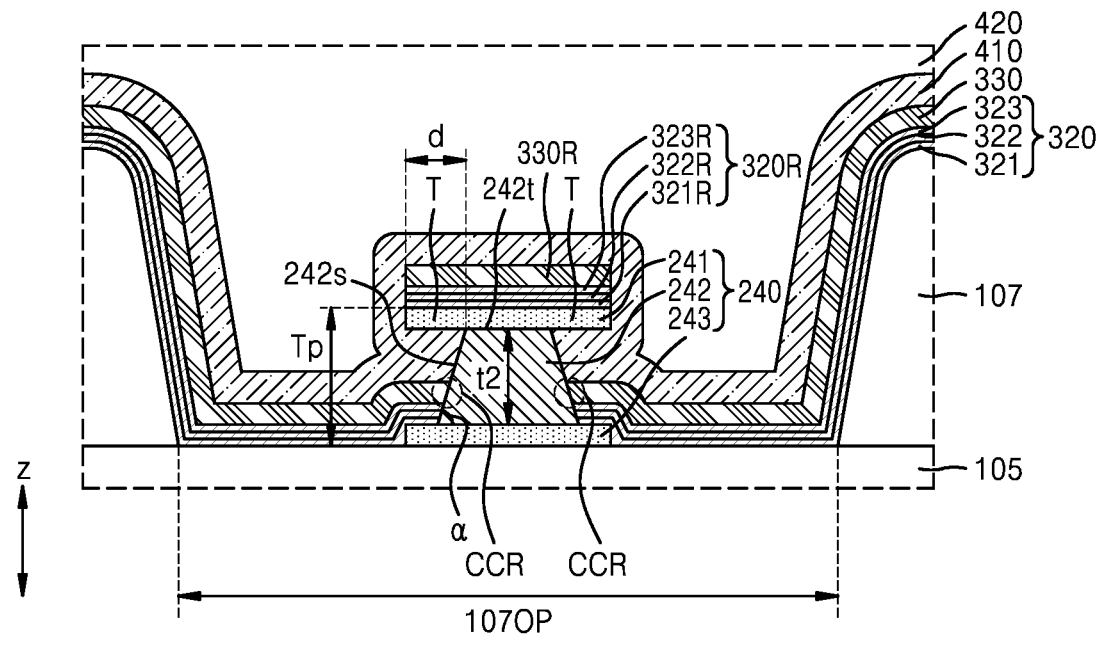
FIG. 7 is an enlarged cross-sectional view of the portion VI of FIG. 6.
Figure 8A:
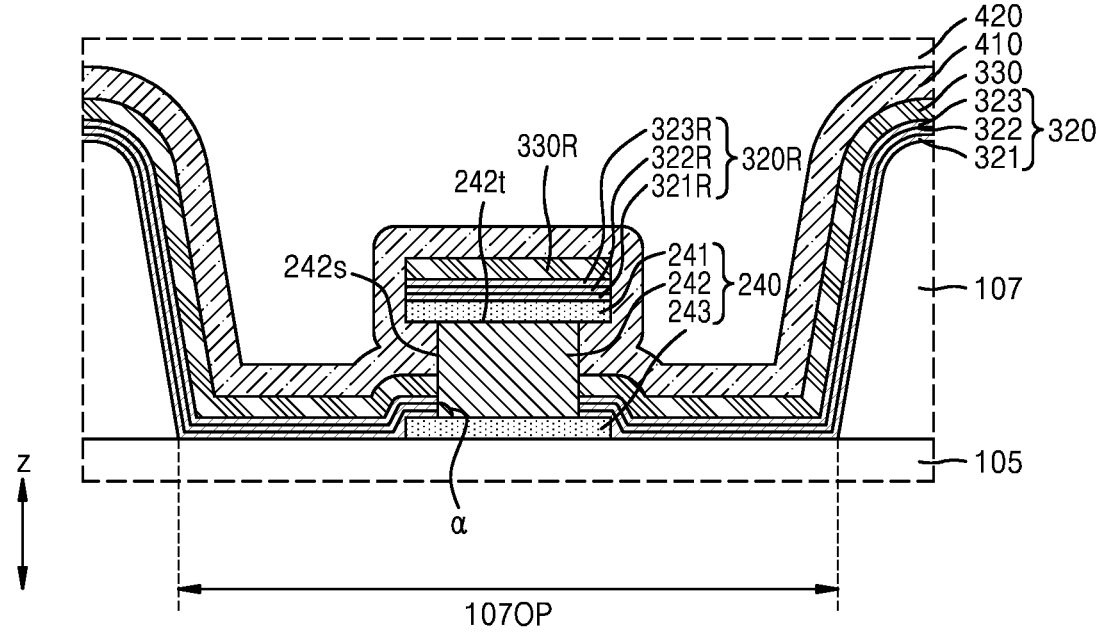
FIGS. 8A and 8B are cross-sectional views each illustrating an auxiliary wiring according to another embodiment.
Figure 8B:
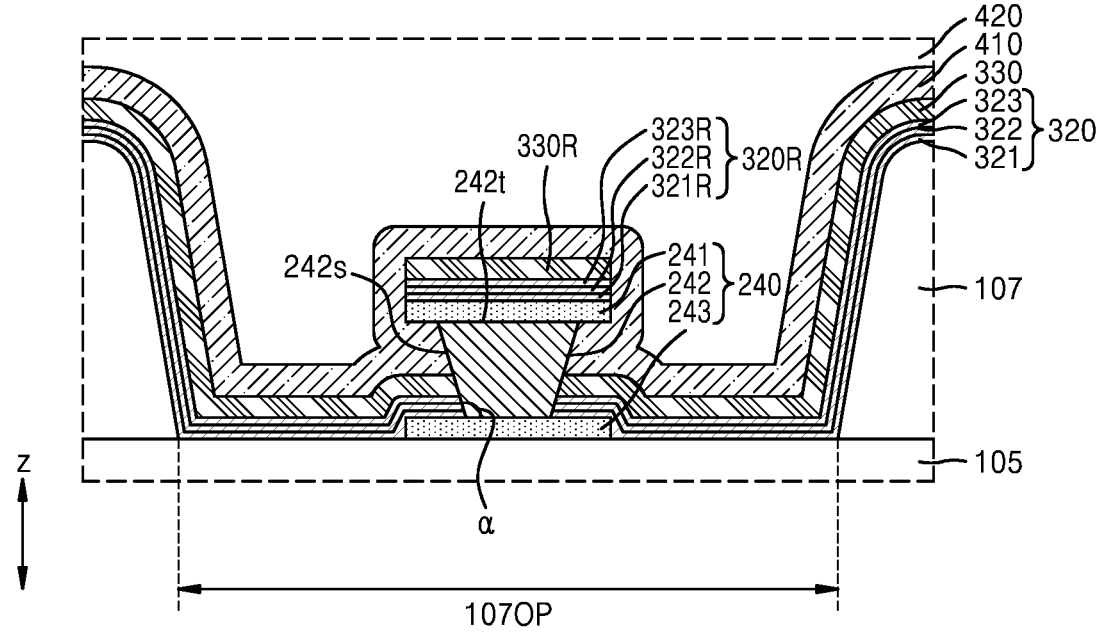

FIG. 6 is a cross-sectional view illustrating a part of a display apparatus according to an embodiment, FIG. 7 is an enlarged cross-sectional view of the portion VI of FIG. 6, and FIGS. 8A and 8B are cross-sectional views each illustrating an auxiliary wiring according to another embodiment.

Referring to FIG. 6, at least one of the auxiliary wirings 240, 240', and 240" described above with reference to FIGS. 5A to 5C may be electrically connected to the second electrode of the light emitting diode in the display area DA. Hereinafter, for convenience of description, the auxiliary wiring 240 shown in FIG. 5A or 5C is electrically connected to the second electrode of the light emitting diode LED, but the first auxiliary wiring 240' and/or the second auxiliary line 240", described with reference to FIG. 5B, may also be electrically connected to the second electrode of the light emitting diode LED. In other words, the auxiliary wiring 240 shown in FIG. 6 may be the first auxiliary wiring 240' and/or the second auxiliary line 240" described with reference to FIG. 5B.

Although FIG. 6 illustrates a first light emitting diode LED1 among a plurality of light emitting diodes disposed in the display apparatus, the second and third light emitting diodes LED2 and LED3 described above with reference to FIG. 2 also have the same structure as the first light emitting diode of FIG. 6.

Referring to FIG. 6, a first light emitting diode LED1 is disposed on a substrate 100. A first pixel circuit PC1 electrically connected to the first light emitting diode LED1 is disposed between the substrate 100 and the first light emitting diode LED1. The first pixel circuit PC1 may include a plurality of transistors and a storage capacitor, as described above with reference to FIG. 4. In this regard, FIG. 6 shows a driving transistor M1.

The substrate 100 may include a glass material or a polymer resin, and the substrate 100 including the polymer resin may have flexibility. For example, the shape of a display apparatus including the substrate 100 having flexibility may be changed to be curved, bendable, rollable, or foldable.

A buffer layer 101 is disposed on the substrate 100, and may prevent impurities from penetrating from the substrate 100 toward the transistor, for example, the driving transistor M1. The buffer layer 101 may include an inorganic insulating material such as silicon oxide, silicon nitride, and/or silicon oxynitride.

A driving semiconductor layer 210 of the driving transistor M1 is disposed on the buffer layer 101. The driving semiconductor layer 210 may include an oxide semiconductor. The oxide semiconductor may include indium gallium zinc oxide (IGZO), zinc tin oxide (ZTO), and indium zinc oxide (IZO). In another embodiment, the driving semiconductor layer 210 may include polysilicon, amorphous silicon, or an organic semiconductor. The driving semiconductor layer 210 may include a channel region 211 overlapping a driving gate electrode 220, and a first region 212 and a second region 213 disposed on both sides of the channel region 211 and doped or conducted with impurities. Any one of the first region 212 and the second region 213 may correspond to a source region and the other one thereof may correspond to a drain region.

The driving gate electrode 220 may overlap the channel region 211 of the semiconductor layer 210 with a gate insulating layer 103 interposed therebetween. The driving gate electrode 220 may include a conductive material such as molybdenum (Mo), aluminum (Al), copper (Cu), or titanium (Ti), and may be formed as multiple layers or a single layer each including the conductive material. The gate insulating layer 103 may include an inorganic insulating material such as silicon oxide, silicon nitride, and/or silicon oxynitride.

An electrode 230 may be disposed on an interlayer insulating layer 105, and may be connected to any one of the first region 212 and the second region 213 of the semiconductor layer 210. In this regard, FIG. 6 shows that the electrode 230 is connected to the second region 213. When the second region 213 is a source (or drain) region, the electrode 230 may correspond to a source (or drain) electrode. The interlayer insulating layer 105 may include an inorganic insulating material such as silicon oxide, silicon nitride, and/or silicon oxynitride.

The driving voltage line 250 may be disposed on the interlayer insulating layer 105, and may be formed together with the interlayer insulating layer 105 in the same process. Each of the electrode 230 and the driving voltage line 250 may be formed of a plurality of sub-layers. For example, the electrode 230 may include a first layer 231, a second layer 232 under the first layer 231, and a third layer 233 under the second layer 232. Similarly, the driving voltage line 250 may include a first layer 251, a second layer 252 under the first layer 251, and a third layer 253 under the second layer 252.

The auxiliary wiring 240 disposed in the display area DA may be disposed adjacent to the first pixel circuit PC1. The auxiliary wiring 240 may be disposed on the same layer as the electrode 230 and/or the driving voltage line 250. In this regard, FIG. 6 shows that the auxiliary wiring 240 is disposed on the interlayer insulating layer 105.

The auxiliary wiring 240 may have a stacked structure of a plurality of conductive layers. The auxiliary wiring 240 may include a main sub-layer 242, an upper layer 241 on the main sub-layer 242, and a lower layer 243 under the main sub-layer 242.

Referring to FIGS. 6 and 7, the main sub-layer 242 may be a sub-layer occupying most of the auxiliary wiring 240. The fact that the main sub-layer 242 occupies most of the auxiliary wiring 240 may indicate that the thickness t2 of the main sub-layer 242 is about 50% or more of the total thickness Tp of the auxiliary wiring 240. In some embodiments, the thickness t2 of the main sub-layer 242 may be about 60% or more or about 70% or more of the total thickness Tp of the auxiliary wiring 240. The thickness t2 of the main sub-layer 242 may be greater than the thickness of each of the upper layer 241 and the lower layer 243. In one embodiment, the main sub-layer 242 may have a thickness of about 1,000 Å to about 15,000 Å

With respect to conductivity, the main sub-layer 242 may include copper (Cu), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), and/or molybdenum (Mo). The main sub-layer 242 may have a single-layer or multi-layer structure including the above-described materials. In some embodiments, the main sub-layer 242 may be a single layer including copper (Cu) or a single layer including aluminum (Al).

The lower layer 243 may include a material different from that of the main sub-layer 242. The lower layer 243 may be selected in consideration of conductivity and adhesivity. For example, the lower layer 243 may be a metal layer including a metal such as titanium (Ti), or may include a transparent conductive oxide (TCO) such as gallium zinc oxide (GZO) and/or indium zinc oxide (IZO). The transparent conductive oxide may be amorphous or crystalline.

The upper layer 241 may be disposed on the main sub-layer 242, and may include a material different from that of the main sub-layer 242. The upper layer 241 may prevent the main sub-layer 242 from being damaged during the manufacturing process of a display apparatus. The upper layer 241 may include a transparent conductive oxide (TCO) such as indium tin oxide (ITO). The upper layer 241 may include a metal such as titanium (Ti), molybdenum (Mo), and/or tungsten (W). Alternatively, the upper layer 241 may have a multilayer structure of the aforementioned metal layer and transparent conductive oxide layer.

The electrode 230 and the driving voltage line 250, disposed on the same layer as the auxiliary wiring 240, may also include the same material as the auxiliary electrode 240. For example, the first layer 231, second layer 232 and third layer 233 of the first electrode 230 may include the same material as the upper layer 241, main sub-layer 242 and lower layer 243 of the auxiliary wiring 240 of the auxiliary wiring 240, respectively. Similarly, the first layer 251, second layer 252 and third layer 253 of the driving voltage line 250 may include the same material as the upper layer 241, main sub-layer 242 and lower layer 243 of the auxiliary wiring 240 of the auxiliary wiring 240, respectively.

The planarization insulating layer 107 may be disposed on the electrode 230, the auxiliary wiring 240, and the driving voltage line 250. The planarization insulating layer 107 may include an organic insulating material such as acrylic resin, benzocyclobutene (BCB), polyimide, and/or hexamethyldisiloxane (HMDSO).

The planarization insulating layer 107 includes a first opening 107OP overlapping the auxiliary wiring 240. The first width W1 of the first opening 107OP is greater than the second width W2 of the auxiliary wiring 240. Accordingly, a part of the upper surface of the insulating layer thereunder, for example, the interlayer insulating layer 105 may be exposed through the first opening 107OP.

The first electrode 310 on the planarization insulating layer 107 may be electrically connected to the first pixel circuit PC1 through a contact hole 107CNT. For example, as shown in FIG. 6, the first electrode 310 may be connected to the electrode 230 through the contact hole 107CNT.

The first electrode 310 may include a transparent conductive material such as indium tin oxide (ITO), indium zinc oxide (IZO), zinc oxide (ZnO), indium oxide ($In_2O_3$), indium gallium oxide (IGO), and/or aluminum zinc oxide (AZO). In another embodiment, the first electrode 310 may include a reflective film including silver (Ag), magnesium (Mg), aluminum (Al), platinum (Pt), palladium (Pd), gold (Au), nickel (Ni), neodymium (Nd), iridium (Ir), chromium (Cr), and/or a compound thereof. In another embodiment, the first electrode 310 may further include a film made of ITO, IZO, ZnO, or $In_2O_3$ on/under the reflective film. For example, the first electrode 310 may have a three-layer structure in which an ITO layer, a silver (Ag) layer, and an ITO layer are stacked.

A bank layer 111 may be disposed on the first electrode 310, and may cover an edge of the first electrode 310. The bank layer 111 includes an opening (hereinafter, referred to as an emission opening 111EOP) overlapping a part of the first electrode 310. The emission opening 111EOP may expose a central portion of the first electrode 310. The bank layer 111 may include an organic material. The bank layer 111 may include a second opening 111OP overlapping the first opening 107OP of the planarization insulating layer 107. The third width W3 of the second opening 111OP may be greater than the first width W1 of the first opening 107OP.

An intermediate layer 320 may contact the first electrode 310 through the emission opening 111EOP. As shown in FIG. 7, the intermediate layer 320 may include an emission layer 322, and may further include a functional layer disposed under and/or on the emission layer 322. In this regard, FIG. 7 shows that the intermediate layer 320 includes a first functional layer 321 disposed under the emission layer 322 and a second functional layer 323 disposed on the emission layer 322.

The first functional layer 321 may have a single-layer structure or a multi-layer structure. The first functional layer 321 may include a hole injection layer (HIL) and/or a hole transport layer (HTL). The emission layer 322 may include a high-molecular or low-molecular weight organic material that emits light of a predetermined color. The second functional layer 323 may include an electron transport layer (ETL) and/or an electron injection layer (EIL).

The second electrode 330 may be made of a conductive material having a low work function. For example, the second electrode 330 may include a (semi) transparent layer including silver (Ag), magnesium (Mg), aluminum (Al), platinum (Pt), palladium (Pd), gold (Au), nickel (Ni), neodymium (Nd), iridium. (Ir), chromium (Cr), lithium (Li), calcium (Ca), and/or an alloy thereof. Alternatively, the second electrode 330 may further include a layer including ITO, IZO, ZnO, or $In_2O_3$ on the (semi)transparent layer including the above-described material.

Unlike the first electrode 310, the intermediate layer 320 and the second electrode 330 may be deposited using a mask having an opening corresponding to the display area DA. Accordingly, the intermediate layer 320 may have an area corresponding to the entire area of the display area DA, and may be cut or separated from the auxiliary wiring 240 by the shape of the auxiliary wiring 240. Similarly, the second electrode 330 may have an area corresponding to the entire area of the display area DA, and may be cut or separated from the auxiliary wiring 240 by the shape of the auxiliary wiring 240. Portions of the second electrode 330, located on both sides of the auxiliary wiring 240, may contact the side surface of the auxiliary wiring 240. Similarly, portions of the intermediate layer 320, located on both sides of the auxiliary wiring 240, may contact the side surface of the auxiliary wiring 240.

As shown in FIG. 7, the auxiliary wiring 240 may be formed such that the width of the upper layer 241 on the main sub-layer 242 is greater than the width of the upper surface of the main sub-layer 242. In other words, in cross-section, the upper layer 241 may include a pair of tips T protruding toward both sides from the point where the side surface 242s and upper surface 242t of the main sub-layer 242 meet. Such a structure may be formed by etching a portion of the auxiliary wiring 240 exposed through the first opening 107OP (for example, etching using an etchant in the process of forming the first electrode 310).

The material of the main sub-layer 242 may be a material having a different etch selectivity from that of the upper layer 241. Similarly, the material of the lower layer 243 may be a material having a different etch selectivity from the material of the main sub-layer 242. In some embodiments, the lower layer 243 may include the same material as the upper layer 241. As the main sub-layer 242 is over-etched than the upper layer 241 by the etchant used in the etching process, a structure having a pair of tips T may be formed, as shown in FIG. 7.

In the deposition process of forming each of the intermediate layer 320 and the second electrode 330, a deposition material may be applied in a direction perpendicular to the substrate 100 (z-direction) and a direction oblique thereto. Accordingly, portions of the intermediate layer 320, located on both sides of the auxiliary wiring 240, may directly contact the side surfaces 242s of the main sub-layer 242, and portions of the second electrode 330, located on both sides of the auxiliary wiring 240, may directly contact the side surface 242s of the main sub-layer 242 to form a contact region CCR. A portion 320R of the intermediate layer 320 and a portion 330R of the second electrode 330 may be respectively separated from other portions of the intermediate layer 320 and other portions of the second electrode 330 while being located on the upper surface 240t of the auxiliary wiring 240.

In some embodiments, when the intermediate layer 320 includes a first functional layer 331, an emission layer 332, and a second functional layer 333, as shown in FIG. 7, each of the first functional layer 331, the emission layer 332, and the second functional layer 333 may include a portion cut around the auxiliary wiring 240 and disposed on both sides of the auxiliary wiring 240, and portions 331R, 332R, and 333R located on the upper surface 240t of the auxiliary wiring 240.

In FIG. 7, the inclination angle α of the side surface 242s of the main sub-layer 242 may be greater than or equal to about 20° and less than about 90°. Although FIGS. 6 and 7 show that the side surface 242s of the main sub-layer 242 has a tapered shape in the forward direction, the embodiments described herein are not limited thereto. In another embodiment, as shown in FIG. 8A, the inclination angle α of the side surface 242s of the main sub-layer 242 may be about 90°. Alternatively, as shown in FIG. 8B, the inclination angle α of the side surface 242s of the main sub-layer 242 may be greater than about 90° and less than or equal to about 135°.

Referring to FIG. 6 again, the light emitting diode having the multi-layer structure of the first electrode 310, the intermediate layer 320, and the second electrode 330, for example, the first light emitting diode LED1 is covered with an encapsulation layer 400. The encapsulation layer 400 may include at least one inorganic encapsulation layer and at least one organic encapsulation layer. In an embodiment, the encapsulation layer 400 may include a first inorganic encapsulation layer 410, an organic encapsulation layer 420, and a second inorganic encapsulation layer 430, which are sequentially stacked.

Each of the first and second inorganic encapsulation layers 410 and 430 may include at least one inorganic insulating material. The inorganic insulating material may include aluminum oxide, tantalum oxide, hafnium oxide, zinc oxide, silicon oxide, silicon nitride, and/or silicon oxynitride. The first and second inorganic encapsulation layers 410 and 430 may be formed through chemical vapor deposition. Since the first inorganic encapsulation layer 410 has relatively excellent step coverage, the first inorganic encapsulation layer 410 may entirely cover the auxiliary wiring 240 although the auxiliary wiring 240 has a shape having a tip T (FIG. 7). For example, the first inorganic encapsulation layer 410 may extend continuously to cover portions of the intermediate layer 320 and second electrode 330 disposed on both sides of the auxiliary wiring 240, a part of the side surface 242s of the main sub-layer 242, the lower surface and side surface of the upper layer 245, and a portion 230R of the intermediate layer 320 on the auxiliary wiring 240 and a portion 330R of the second electrode 33 on the auxiliary wiring 240.

The organic encapsulation layer 420 may include a polymer-based material. The polymer-based material may include an acrylic resin, an epoxy-based resin, polyimide, polyethylene, and the like. The acrylic resin may include, for example, polymethyl methacrylate, polyacrylic acid, and the like.

A color conversion-transmitting layer 500 and a color layer 600 may be disposed on the encapsulation layer 400. In this regard, FIG. 6 shows that the first color conversion unit 510 of the color conversion-transmitting layer 500 is disposed to overlap the first light emitting diode LED1, and the first color filter 610 of the color layer 600 is disposed to overlap on the first light emitting diode LED1. The first color conversion unit 510 and the first color filter 610 may be surrounded by light blocking units 540 and 640, respectively. In this regard, FIG. 6 shows light blocking units 540 and 640 disposed on both sides of the first color conversion unit 510 and the first color filter 610, respectively. The light blocking units 540 and 640 may include a light blocking material such as a black matrix, and the auxiliary wiring 240 may overlap the light blocking units 540 and 640.

Figure 9A:
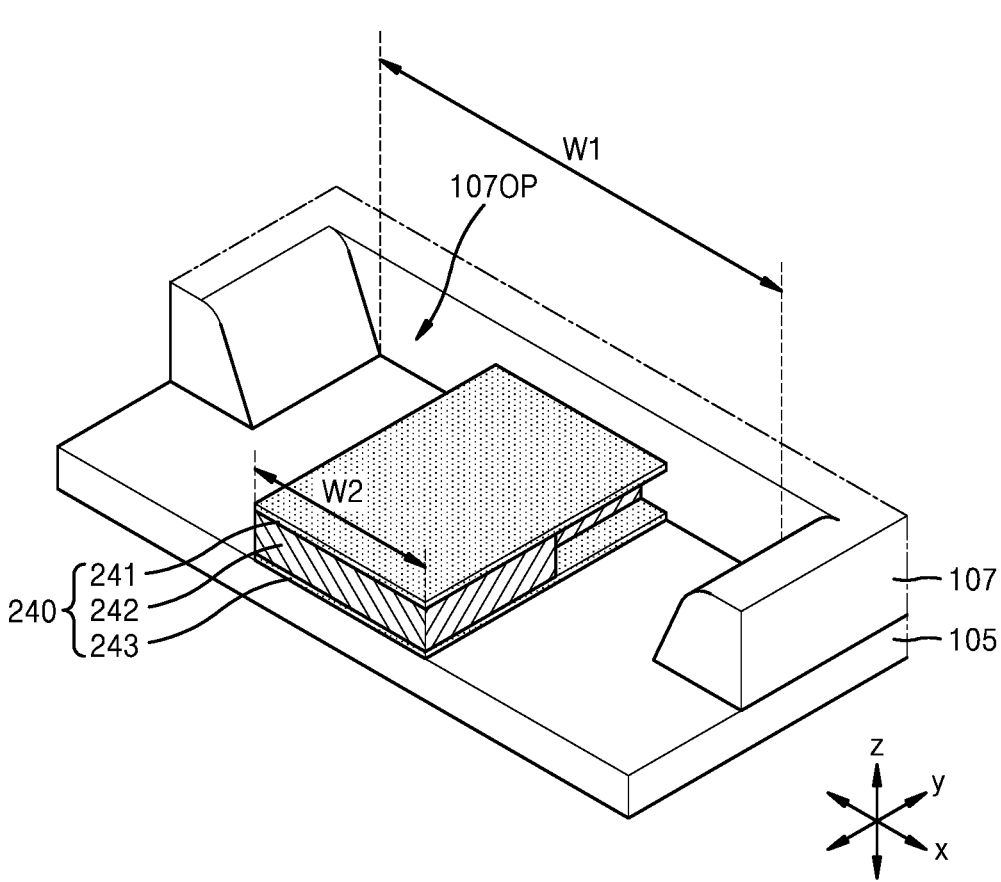
FIG. 9A is a perspective view schematically illustrating an auxiliary wiring and a first opening of a planarization insulating layer on the auxiliary wiring according to an embodiment.
Figure 9B:
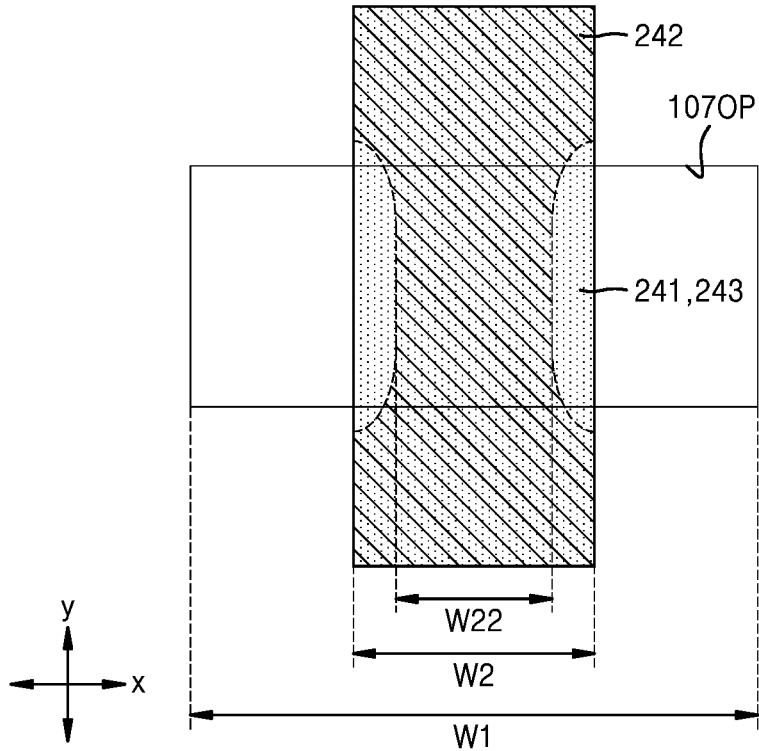
FIG. 9B is a plan view schematically illustrating the auxiliary wiring and first opening of FIG. 9A.

FIG. 9A is a perspective view schematically illustrating an auxiliary wiring and a first opening of a planarization insulating layer on the auxiliary wiring according to an embodiment, and FIG. 9B is a plan view schematically illustrating the auxiliary wiring and first opening of FIG. 9A.

Referring to FIGS. 9A and 9B, the first width W1 of the first opening 107OP of the planarization insulating layer 107 may be formed to be greater than the second width W2 of a portion of the auxiliary wiring 240 overlapping the first opening 107OP.

In a portion of the auxiliary wiring 240 overlapping the material portion of the planarization insulating layer 107, the upper layer 241, the main sub-layer 242, and the lower layer 243 may be formed to have relatively the same width. On the other hand, since the portion of the auxiliary wiring 240 overlapping the first opening 107OP is etched by an etchant as described above, the cross-sectional shapes of the upper layer 241, the main sub-layer 242, and the lower layer 243 may have the same structure as that described above with reference to FIGS. 6 and 7 (or FIGS. 8A and 8B). In other words, the size or area of the main sub-layer 242 overlapping the first opening 107OP may be less than the size or area of the upper layer 241. In this regard, in FIG. 9B, the solid line indicates an outline (corresponding to the side surface in cross-section) of the upper layer 241 and/or the lower layer 243 in a plan view, and the dotted line indicates an outline (corresponding to the side surface in cross-section) of the main sub-layer 242 in the plan view. As shown in FIG. 9B, a width of the upper layer 241 and/or the lower layer 243 may corresponds to the second width W2, and a width W22 of the main sub-layer 242 may be less than the width (for example, the second width W2) of the upper layer 241 and/or the lower layer 243.

In FIG. 9B, the dotted line overlapping the first opening 107OP corresponds to the contact region CCR (FIG. 7) formed by direct contact between the auxiliary wiring 240 and the second electrode 330, described with reference to FIG. 7.

Although FIGS. 9A and 9B show that the auxiliary wiring 240 overlapping the first opening 107OP has a relatively constant width along the x-direction, the embodiments described herein are not limited thereto. In another embodiment, as shown in FIGS. OA, 10B, and 10C, the auxiliary wiring 240 may include a protrusion protruding in a direction (x direction) crossing the extension direction (y direction) of the auxiliary wiring 240.

Figure 10A:
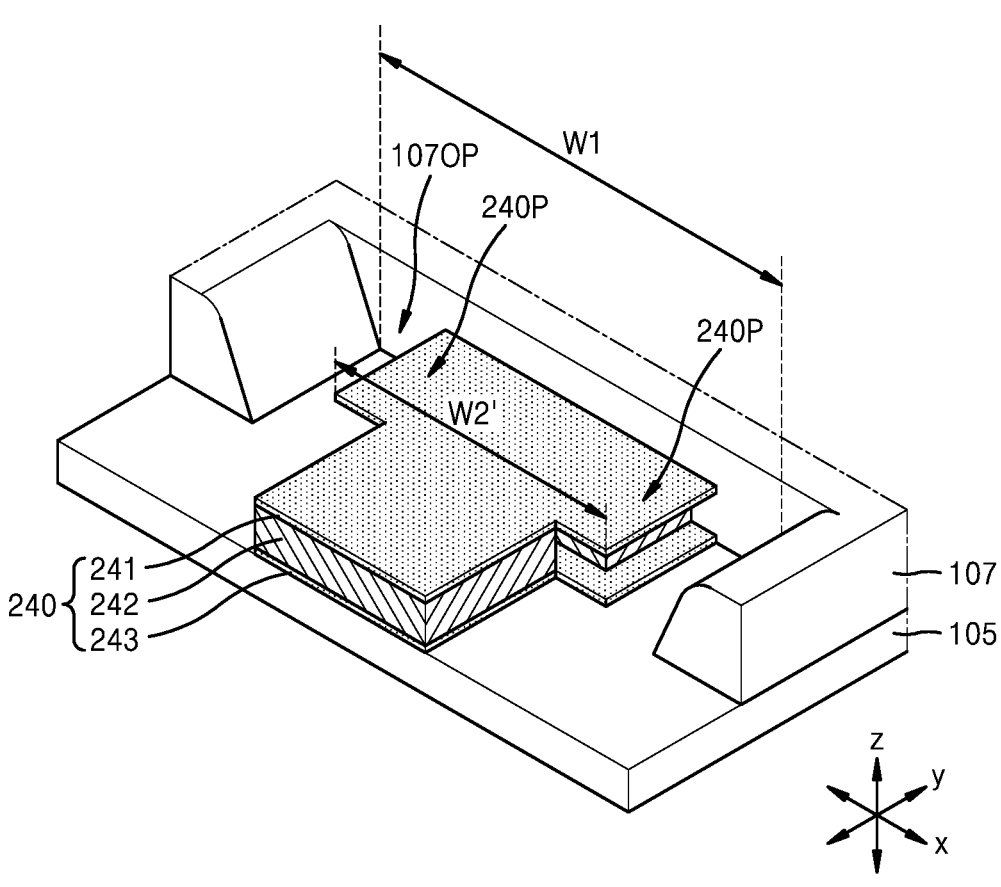
FIG. 10A is a perspective view schematically illustrating an auxiliary wiring and a first opening of a planarization insulating layer on the auxiliary wiring according to another embodiment.
Figure 10B:
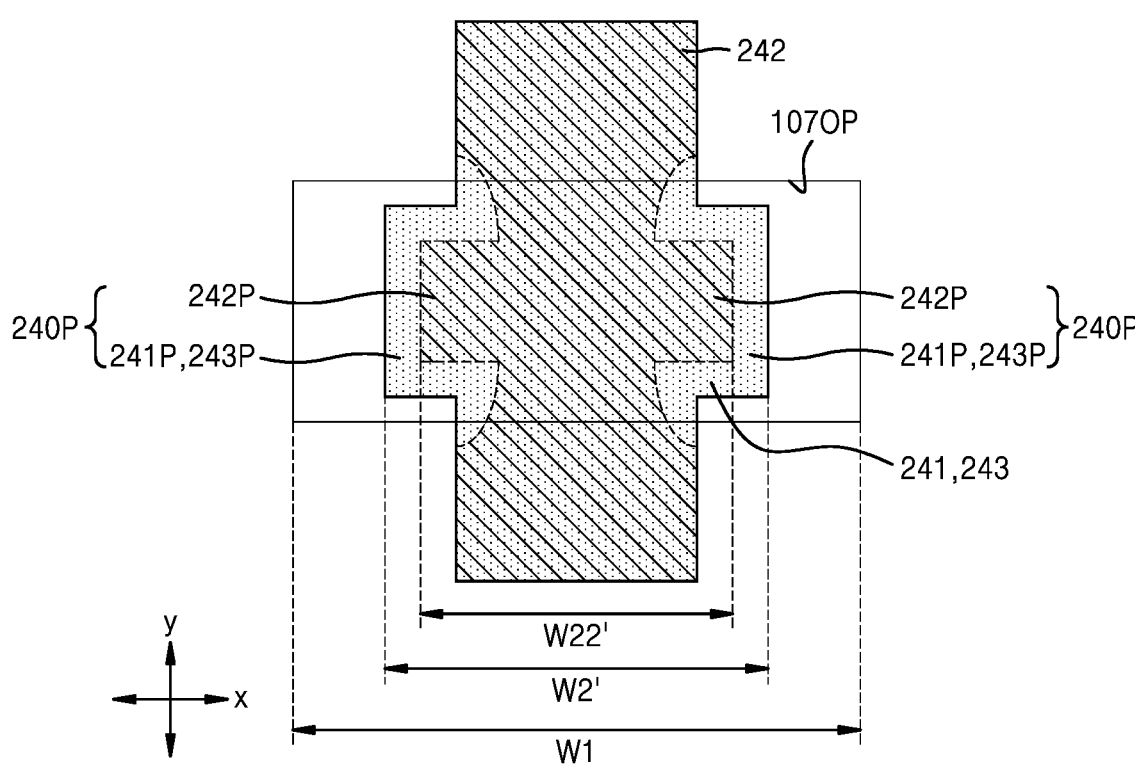
FIG. 10B is a plan view illustrating an auxiliary wiring and a first opening of a planarization insulating layer on the auxiliary wiring according to another embodiment, and is a plan view schematically illustrating the auxiliary wiring and first opening of FIG. 10A.
Figure 10C:
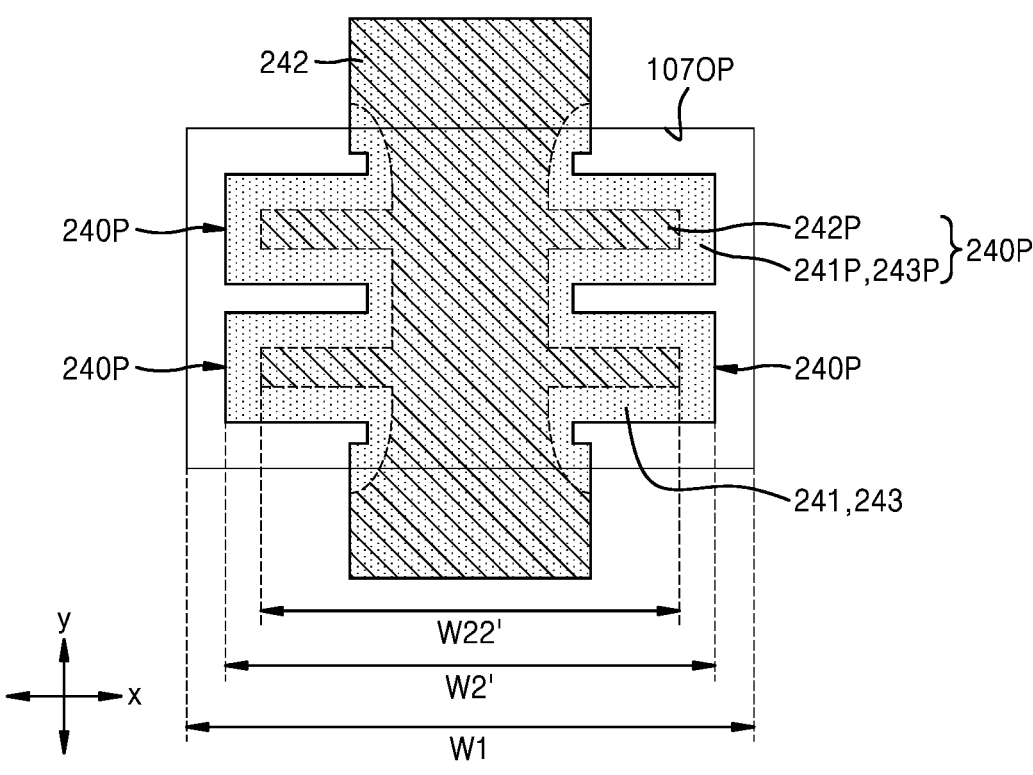
FIG. 10C is a plan view illustrating an auxiliary wiring and a first opening of a planarization insulating layer on the auxiliary wiring according to still another embodiment.

FIG. 10A is a perspective view schematically illustrating an auxiliary wiring and a first opening of a planarization insulating layer on the auxiliary wiring according to another embodiment, FIG. 10B is a plan view illustrating an auxiliary wiring and a first opening of a planarization insulating layer on the auxiliary wiring according to another embodiment, and is a plan view schematically illustrating the auxiliary wiring and first opening of FIG. 10A, and FIG. 10C is a plan view illustrating an auxiliary wiring and a first opening of a planarization insulating layer on the auxiliary wiring according to still another embodiment.

Referring to FIG. 10A, the auxiliary wiring 240 may include protrusions 240P protruding in a direction (x direction) crossing the extension direction (y direction) of the auxiliary wiring 240. For example, as shown in FIG. 10A, one protrusion 240P may be disposed at each of both sides of the auxiliary wiring 240. Although FIGS. 10A and 10B show that the auxiliary wiring 240 includes a pair of protrusions 240P, in another embodiment, the auxiliary wiring 240 may include a plurality of pairs of protrusions 240P.

As the auxiliary wiring 240 includes the protrusions 240P, the upper layer 241, main sub-layer 242 and lower layer 243 included in the auxiliary wiring 240 also include protrusions 241P, 242P, and 243P, respectively.

The protrusions 240P of the auxiliary wiring 240 overlap the first opening 107OP of the planarization insulating layer 107, and the first width W1 of the second opening 107OP may be formed to be greater than the second width W2' of a portion of the auxiliary wiring 240 overlapping the first opening 107OP. The second width W2' may correspond to the maximum width of a portion of the auxiliary wiring 240 overlapping the first opening 107OP. For example, when the protrusions 240P are disposed at both sides of the auxiliary wiring 240, the second width W2' may correspond to a distance from an end of one protrusion 240P to an end of the other protrusion 240P. The second width W2' may be greater than the second width W2 of a portion of the auxiliary wiring 240 that does not overlap the first opening 107OP.

Since the portion of the auxiliary wiring 240 overlapping the first opening 107OP is etched by an etchant as described above, the cross-sectional shapes of the upper layer 241, the main sub-layer 242, and the lower layer 243 may have the same structure as that described above with reference to FIGS. 6 and 7 (or FIGS. 8A and 8B). In this regard, in FIGS. 10B and 10C, the solid line indicates an outline (corresponding to the side surface in cross-section) of the upper layer 241 and/or the lower layer 243 in a plan view, and the dotted line indicates an outline (corresponding to the side surface in cross-section) of the main sub-layer 242 in the plan view. As shown in FIGS. 10B and 10C, a width of the upper layer 241 and/or the lower layer 243 may corresponds to the second width W2', and a width W22' of the main sub-layer 242 may be less than the width (for example, the second width W2') of the upper layer 241 and/or the lower layer 243.

In FIGS. 10B and 10C, the dotted line overlapping the first opening 107OP corresponds to a contact region CCR (FIG. 7) formed by direct contact between the auxiliary wiring 240 and the second electrode 330, described with reference to FIG. 7. In other words, the contact area between the second electrode 330 and the side surface of the auxiliary wiring 240 (for example, the side surface of the main sub layer 242) may be continuous along at least one side surface of the protrusions 240P of the auxiliary wiring 240. As shown in FIGS. 10B and 10C, when the auxiliary wiring 240 includes the protrusions 240P, the contact area between the auxiliary wiring 240 and the second electrode 330, for example, the contact region CCR, may increase.

Figure 11A:
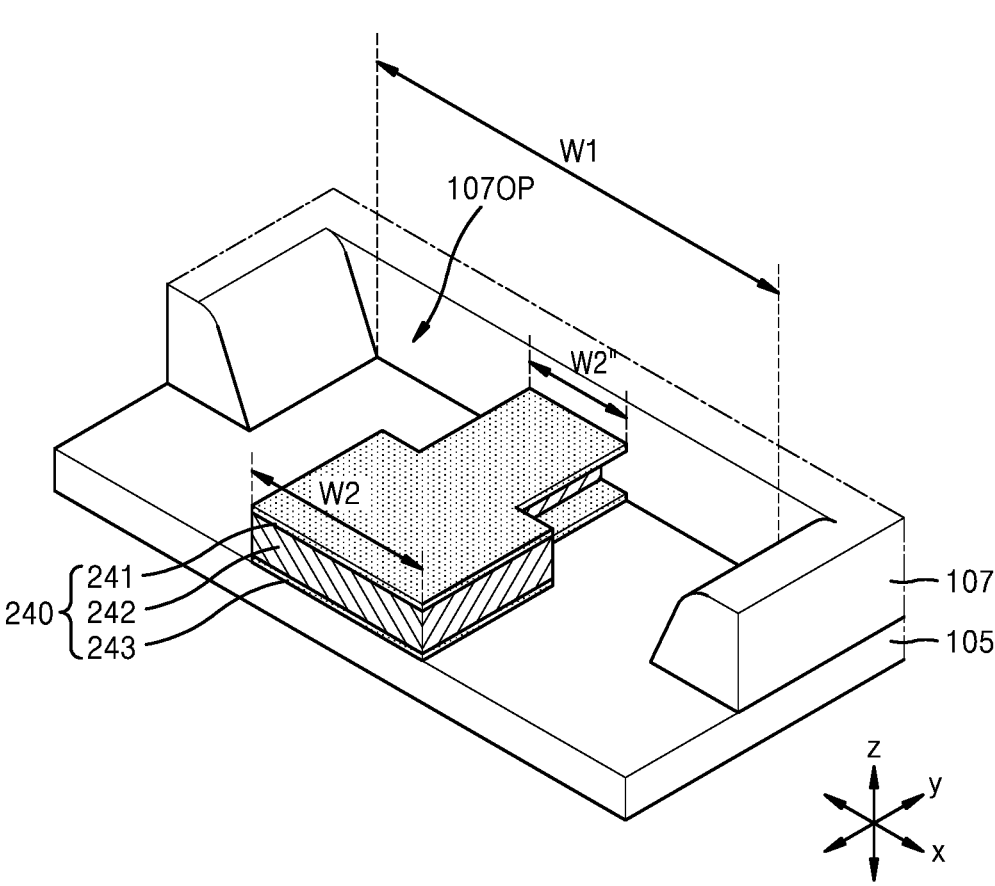
FIG. 11A is a perspective view schematically illustrating an auxiliary wiring and a first opening of a planarization insulating layer on the auxiliary wiring according to still another embodiment.
Figure 11B:
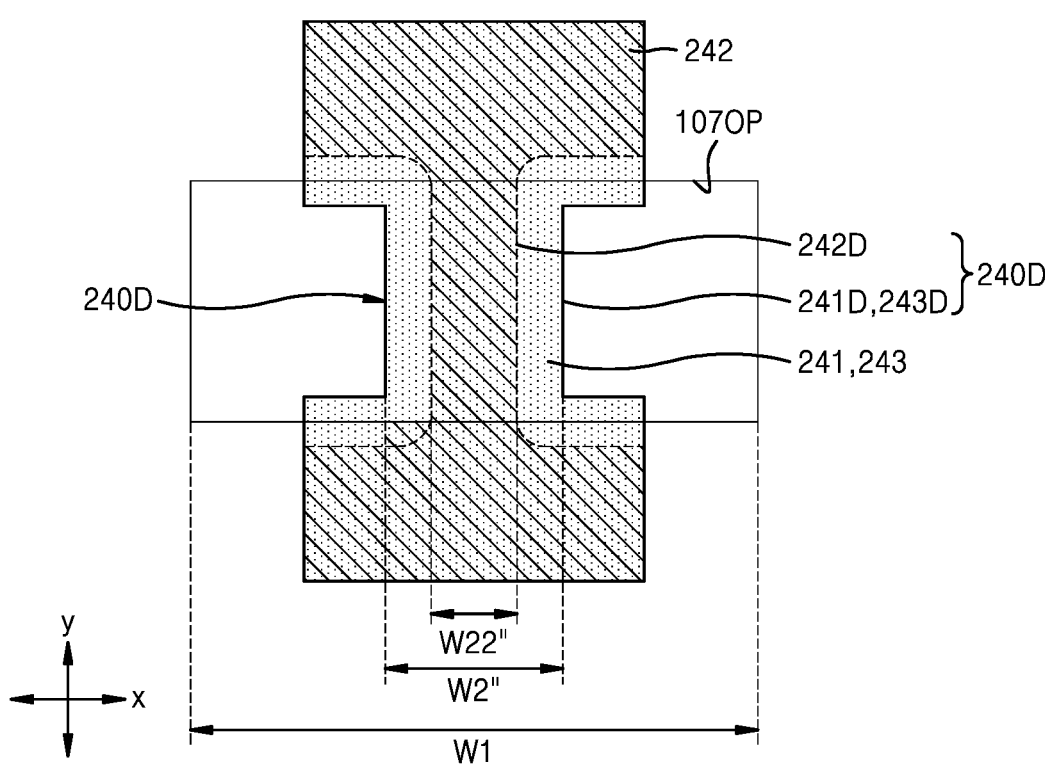
FIG. 11B is a plan view illustrating an auxiliary wiring and a first opening of a planarization insulating layer on the auxiliary wiring according to still another embodiment.

FIG. 11A is a perspective view schematically illustrating an auxiliary wiring and a first opening of a planarization insulating layer on the auxiliary wiring according to still another embodiment, and FIG. 11B is a plan view illustrating an auxiliary wiring and a first opening of a planarization insulating layer on the auxiliary wiring according to still another embodiment.

Referring to FIG. 11A, the auxiliary wiring 240 may include recesses 240D that are depressed in a direction (x direction) crossing the extension direction (y direction) of the auxiliary wiring 240. For example, as shown in FIG. 11A, one recess 240D may be disposed at each of both sides of the auxiliary wiring 240. Although FIGS. 11A and 11B show that the auxiliary wiring 240 includes a pair of recesses 240D, in another embodiment, the auxiliary wiring 240 may include a plurality of pairs of recesses 240D.

As the auxiliary wiring 240 includes the recesses 240D, the upper layer 241, main sub-layer 242 and lower layer 243 included in the auxiliary wiring 240 also include recesses 241D, 242D, and 243D, respectively.

The recesses 240D of the auxiliary wiring 240 overlap the first opening 107OP of the planarization insulating layer 107, and the first width W1 of the second opening 107OP may be formed to be greater than the second width W2" of a portion of the auxiliary wiring 240 overlapping the first opening 107OP. The second width W2" may correspond to the minimum width of a portion of the auxiliary wiring 240 overlapping the first opening 107OP. For example, when the recesses 240D are disposed at both sides of the auxiliary wiring 240, the second width W2" may correspond to a distance from an end of one recess 240D to an end of the other recess 240D. The second width W2" may be greater than the second width W2 of a portion of the auxiliary wiring 240 that does not overlap the first opening 107OP.

As shown in FIG. 11B, a width of the upper layer 241 and/or the lower layer 243 may correspond to the second width W2", and a width W22" of the main sub-layer 242 may be less than the width (for example, the second width W2") of the upper layer 241 and/or the lower layer 243.

In FIG. 11B and with reference also to FIG. 7, the dotted line overlapping the first opening 107OP corresponds to a contact region CCR. That is, the contact area between the second electrode 330 and the side surface of the auxiliary wiring 240 (for example, the side surface of the main sub layer 242) may be continuous along at least one side surface of the recesses 240D of the auxiliary wiring 240. As shown in FIG. 11B, when the auxiliary wiring 240 includes the recesses 240D, the contact area between the auxiliary wiring 240 and the second electrode 330, for example, the contact region CCR, may increase. Although it is shown in FIGS. 11A and 11B that the width of the main sub-layer 242 is formed to be less than the width of the upper layer 241 and/or the lower layer 243, in another embodiment, the auxiliary wiring 240 includes the recesses 240D, so that process conditions may be changed when the second width W2" of the portion overlapping the first opening 107OP becomes very narrow. In the portion of the auxiliary wiring 240 overlapping the first opening 107OP, the upper layer 241, the main sub-layer 242, and the lower layer 243 may be formed to have relatively the same width. In other words, the size or area of the main sub-layer 242 overlapping the first opening 107OP may be relatively the same as the size or area of the upper layer 241.

According to the above-described embodiments, it is possible to provide a display apparatus in which display quality may be improved and the area of a dead space located around a display area may be reduced. However, the above-described embodiments are not limited by such effects.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
   an auxiliary wiring disposed on a substrate;
      an insulating layer disposed on the auxiliary wiring and that includes a first opening that overlaps the auxiliary wiring and has a greater width than a width of the auxiliary wiring;
      a first electrode on the insulating layer;
      a bank layer that includes an emission opening overlapping the first electrode;
      an intermediate layer that overlaps the first electrode through the emission opening and that includes an emission layer;
      a second electrode disposed on the intermediate layer; and
      a first inorganic encapsulation layer disposed on the second electrode,
   wherein the auxiliary wiring includes a plurality of sub-layers, the second electrode contacts a side surface of any one of the plurality of sub-layers through the first opening of the insulating layer, and
   wherein the first inorganic encapsulation layer extends continuously to cover portions of the intermediate layer and the second electrode, the second electrode being disposed on both opposite sides of the auxiliary wiring, wherein the plurality of sub-layers of the auxiliary wiring includes a main sub-layer, an upper layer disposed over the main sub-layer and that has a tip protruding from a point at which side and upper surfaces of the main sub-layer meet each other, and a lower layer disposed under the main sub-layer, wherein the second electrode directly contacts the side surface of the main sub-layer, and wherein each of the main sub-layer, the upper layer, and the lower layer includes a conductive material.

2. The display apparatus of claim 1, wherein a thickness of the main sub-layer is greater than at least one of a thickness of the upper layer and a thickness of the lower layer.

3. The display apparatus of claim 1, wherein the intermediate layer overlaps the first electrode and the auxiliary wiring, and a part of the intermediate layer is located on the auxiliary wiring while being separated from another part of the intermediate layer by the tip around the auxiliary wiring.

4. The display apparatus of claim 1, wherein the second electrode overlaps the first electrode and the auxiliary wiring, and a part of the second electrode is located on the auxiliary wiring while being separated from another part of the second electrode by the tip around the auxiliary wiring.

5. The display apparatus of claim 1, wherein the main sub-layer includes at least one selected from among copper (Cu), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), and molybdenum (Mo).

6. The display apparatus of claim 1, wherein at least one of the upper layer and the lower layer includes at least one selected from among indium tin oxide (ITO), titanium (Ti), molybdenum (Mo), and tungsten (W).

7. The display apparatus of claim 1, further comprising a lower insulating layer disposed under the auxiliary wiring, wherein a part of the intermediate layer directly contacts a part of an upper surface of the lower insulating layer through the first opening of the insulating layer.

8. The display apparatus of claim 1, wherein, in a plan view, the auxiliary wiring includes a plurality of protrusions protruding in a direction crossing an extension direction of the auxiliary wiring.

9. The display apparatus of claim 8, wherein a contact region of the second electrode and the side surface of the auxiliary wiring is continuous along a side surface of the at least one of the plurality of protrusions.

10. An electronic apparatus comprising:

a substrate disposed in a display area and a non-display area around the display area;

a common voltage supply line disposed in the non-display area;

an auxiliary wiring electrically connected to the common voltage supply line and disposed in the display area;

an insulating layer disposed on the auxiliary wiring and that includes a first opening that overlaps the auxiliary wiring and has a greater width than a width of the auxiliary wiring;

a first electrode disposed on the insulating layer;

a bank layer that includes an emission opening that overlaps the first electrode;

an intermediate layer that overlaps the first electrode through the emission opening and that includes an emission layer;

a second electrode disposed on the intermediate layer; and a first inorganic encapsulation layer disposed on the second electrode, wherein the auxiliary wiring includes a plurality of sub-layers, the second electrode contacts a side surface of any one of the plurality of sub-layers through the first opening of the insulating layer, and wherein the first inorganic encapsulation layer extends continuously to cover portions of the intermediate layer and the second electrode, the second electrode being disposed on opposite sides of the auxiliary wiring, wherein the plurality of sub-layers of the auxiliary wiring includes a main sub-layer, an upper layer disposed over the main sub-layer and having a tip protruding from a side surface of the main sub-layer, and a lower layer disposed under the main sub-layer, wherein the second electrode directly contacts the side surface of the main sub-layer, and wherein each of the main sub-layer, the upper layer, and the lower layer comprises a conductive material.

11. The electronic apparatus of claim 10, wherein a thickness of the main sub-layer is greater than at least one of a thickness of the upper layer and a thickness of the lower layer.

12. The electronic apparatus of claim 10, wherein the intermediate layer overlaps the first electrode and the auxiliary wiring, and a part of the intermediate layer is located on the auxiliary wiring while being separated from another part of the intermediate layer by the tip around the auxiliary wiring.

13. The electronic apparatus of claim 10, wherein the second electrode overlaps the first electrode and the auxiliary wiring, and a part of the second electrode is located on the auxiliary wiring while being separated from another part of the second electrode by the tip around the auxiliary wiring.

14. The electronic apparatus of claim 10, wherein the main sub-layer includes at least one selected from among copper (Cu), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), and molybdenum (Mo).

15. The electronic apparatus of claim 10, wherein at least one of the upper layer and the lower layer includes at least one selected from among indium tin oxide (ITO), titanium (Ti), molybdenum (Mo), and tungsten (W).

16. The electronic apparatus of claim 10, further comprising:

a lower insulating layer disposed under the auxiliary wiring, wherein a part of the intermediate layer directly contacts a part of an upper surface of the lower insulating layer through the first opening of the insulating layer.

17. The electronic apparatus of claim 10, wherein, in a plan view, the auxiliary wiring includes a plurality of protrusions protruding in a direction crossing an extension direction of the auxiliary wiring.

18. The electronic apparatus of claim 17, wherein a contact region of the second electrode and the side surface of the auxiliary wiring is continuous along a side surface of at least one of the plurality of protrusions.

\* \* \* \* \*